(12) United States Patent
Hirosaki et al.

(10) Patent No.: US 9,515,230 B2
(45) Date of Patent: *Dec. 6, 2016

(54) FLUOROPHORE, METHOD FOR PRODUCING SAME, LIGHT-EMITTING DEVICE, AND IMAGE DISPLAY DEVICE

(71) Applicant: National Institute for Materials Science, Ibaraki (JP)

(72) Inventors: Naoto Hirosaki, Ibaraki (JP); Takashi Takeda, Ibaraki (JP); Shiro Funahashi, Ibaraki (JP); Eiichirou Narimatsu, Ibaraki (JP)

(73) Assignee: National Institute for Materials Science, Tsukoba-shi (JP)

( * ) Notice: Subject to any disclaimer, the term of this patent is extended or adjusted under 35 U.S.C. 154(b) by 91 days.

This patent is subject to a terminal disclaimer.

(21) Appl. No.: 14/416,568

(22) PCT Filed: Jul. 25, 2013

(86) PCT No.: PCT/JP2013/070156
§ 371 (c)(1),
(2) Date: Jan. 22, 2015

(87) PCT Pub. No.: WO2014/017580
PCT Pub. Date: Jan. 30, 2014

(65) Prior Publication Data
US 2015/0175881 A1    Jun. 25, 2015

(30) Foreign Application Priority Data

Jul. 25, 2012  (JP) ................................. 2012-164558

(51) Int. Cl.
*H01L 33/50* (2010.01)
*C09K 11/08* (2006.01)
(Continued)

(52) U.S. Cl.
CPC ......... *H01L 33/502* (2013.01); *C09K 11/0883* (2013.01); *C09K 11/7734* (2013.01);
(Continued)

(58) Field of Classification Search
CPC  C09K 11/7734; H01L 33/502; H01L 33/504
See application file for complete search history.

(56) References Cited

U.S. PATENT DOCUMENTS

2006/0192178 A1   8/2006  Hirosaki
2007/0007494 A1   1/2007  Hirosaki et al.
(Continued)

FOREIGN PATENT DOCUMENTS

JP    A 2005112922 A    4/2005
JP    B3668770          4/2005
(Continued)

OTHER PUBLICATIONS

Park et al, "Combinatorial chemistry of oxynitride phosphors and discovery of a novel phoshor for use in light emitting diode, Ca1.5Ba0.5Si5N6O3:Eu2+", Journal of Materials Chemisty C, 2013, 1, pp. 1832-1839, Jan. 3, 2013.*

*Primary Examiner* — Carol M Koslow
(74) *Attorney, Agent, or Firm* — Trojan Law Offices

(57) ABSTRACT

Provided is chemically and thermally stable phosphor having light-emitting characteristics different from the conventional phosphor and high emission intensity when combined with LED of not exceeding 470 nm. The phosphor comprises inorganic compound having crystal represented by $A_2(D,E)_5X_9$; crystal represented by $Ca_2Si_5O_3N_6$; or inorganic crystal having the same crystal structure as crystal represented by $Ca_2Si_5O_3N_6$, which includes A, D, E, and X elements (A is one or more kinds selected from Mg, Ca, Sr, and Ba; D is one or more kinds selected from Si, Ge, Sn, Ti, Zr, and Hf; E is one or more kinds selected from B, Al, Ga, In, Sc, Y, and La; and X is one or more kinds selected from O, N, and F), in which M element (M is one or more kinds of elements selected from Mn, Ce, Pr, Nd, Sm, Eu, Tb, Dy, and Yb) is solid-solved.

36 Claims, 5 Drawing Sheets

Crystal structure of $Ca_{1.54}Eu_{0.46}Si_5O_3N_6$

(51) Int. Cl.

| | | |
|---|---|---|
| | *C09K 11/59* | (2006.01) |
| | *C09K 11/64* | (2006.01) |
| | *C09K 11/79* | (2006.01) |
| | *C09K 11/80* | (2006.01) |
| | *C09K 11/77* | (2006.01) |
| | *H01J 1/63* | (2006.01) |
| | *H01L 25/065* | (2006.01) |
| | *H01L 27/15* | (2006.01) |

(52) U.S. Cl.
CPC ............ *H01J 1/63* (2013.01); *H01L 25/0655* (2013.01); *H01L 27/156* (2013.01); *H01L 33/504* (2013.01); *H01L 2224/45144* (2013.01); *H01L 2224/48091* (2013.01); *H01L 2224/48247* (2013.01); *H01L 2224/8592* (2013.01); *H01L 2924/12044* (2013.01); *H01L 2924/181* (2013.01)

(56) References Cited

U.S. PATENT DOCUMENTS

| | | |
|---|---|---|
| 2007/0018567 A1 | 1/2007 | Hirosaki |
| 2007/0108896 A1 | 5/2007 | Hirosaki |
| 2009/0236969 A1 | 9/2009 | Hirosaki |
| 2011/0121234 A1 | 5/2011 | Hirosaki |

FOREIGN PATENT DOCUMENTS

| | | |
|---|---|---|
| JP | B 3668770 B2 | 4/2005 |
| JP | B3837551 | 8/2006 |
| JP | B 3837551 B2 | 8/2006 |
| JP | B 3837588 B2 | 8/2006 |
| JP | B 3921545 B2 | 3/2007 |
| JP | B4524368 | 6/2010 |
| JP | B 4524368 B2 | 6/2010 |
| WO | WO 2005019376 A | 3/2005 |
| WO | WO 2006101096 A | 9/2006 |
| WO | WO 2007066733 A | 6/2007 |

* cited by examiner

Crystal structure of $Ca_{1.54}Eu_{0.46}Si_5O_3N_6$

FLUOROPHORE, METHOD FOR PRODUCING SAME, LIGHT-EMITTING DEVICE, AND IMAGE DISPLAY DEVICE

TECHNICAL FIELD

The present invention relates to a fluorophore (phosphor), a manufacture thereof, and an application thereof, wherein the phosphor comprises: an inorganic compound comprising: a crystal represented (expressed, designated) by $A_2$ (D, E)$_5X_9$ wherein at least one of D and E is present (here, A is one or two or more kinds of elements selected from the group consisting of Mg, Ca, Sr, and Ba; D is one or two or more kinds of elements selected from the group consisting of Si, Ge, Sn, Ti, Zr, and Hf; E is one or two or more kinds of elements selected from the group consisting of B, Al, Ga, In, Sc, Y, and La; and X is one or two or more kinds of elements selected from the group consisting of O, N, and F), a crystal represented by $Ca_2Si_5O_3N_6$, an inorganic crystal having the identical crystal structure to the structure of the crystal represented by the $Ca_2Si_5O_3N_6$, or a solid solution crystal of these crystals, into each of which an M element (M is one or two or more kinds of elements selected from the group consisting of Mn, Ce, Pr, Nd, Sm, Eu, Tb, Dy, and Yb) is solid-solved.

BACKGROUND ART

The phosphor is utilized in a fluorescent display tube (VFD: vacuum-fluorescent display), a field emission display (FED: Field Emission Display) or SED (Surface-Conduction Electron-Emitter Display), a plasma display panel (PDP: Plasma Display Panel), a cathode-ray tube (CRT: Cathode-Ray Tube), a liquid-crystal display backlight, a white light-emitting diode (LED: Light-Emitting Diode), and so on. In any of these applications, it is necessary to provide the phosphor with energy to excite the phosphor in order to make the phosphor emit fluorescence and the phosphor is excited by an excitation source with high energy such as a vacuum ultraviolet ray, an ultraviolet ray, an electron beam, and blue light so as to emit a visible light ray such as blue light, green light, yellow light, orange light, and red light. However, as a result of the phosphor being exposed to such excitation source, the luminance of the phosphor tends to decrease and a phosphor having little degradation in the brightness is desired. Therefore, a phosphor having an inorganic crystal containing nitrogen in a crystal structure thereof as a host crystal, instead a conventional phosphor such as a silicate phosphor, a phosphate phosphor, a aluminate phosphor, and a sulfide phosphor, has been proposed, as exemplified by a sialon phosphor, an oxynitride phosphor, or a nitride phosphor, which is characterized by low brightness deterioration caused by high energy excitation.

An example of the sialon phosphors is manufactured by a manufacturing process as generally described below. First, silicon nitride ($Si_3N_4$), aluminum nitride (AlN), and europium oxide ($Eu_2O_3$) are mixed in predetermined molar ratios and the resultant mixture is fired by a hot press method in one atmospheric pressure (0.1 MPa) of nitrogen atmosphere at 1700° C. for one hour (for example, refer to Patent Reference 1). It was reported that α-sialon activated with an Eu ion ($Eu^{2+}$) manufactured by the above processes had become a phosphor emitting yellow light in a wavelength range of 550 nm to 600 nm if excited by blue light having a wavelength range of 450 to 500 nm. And it is known that an emission wavelength may vary as a ratio of Si to Al or a ratio of oxygen to nitrogen is changed while the α-sialon crystal structure is maintained (for example, refer to Patent References 2 and 3).

As another example of the sialon phosphor, a green phosphor in which β type sialon is activated by $Eu^{2+}$ is known (refer to Patent Reference 4). It is known that, in the phosphor, an emission wavelength thereof may shift to a shorter wavelength by changing the oxygen content while the crystal structure remains the same (for example, refer to Patent Reference 5). Moreover, it is known that a blue phosphor is to be formed when β-sialon is activated by $Ce^{3+}$ (for example, refer to Patent Reference 6).

As an example of an oxynitride phosphor, a blue phosphor having a JEM phase (LaAl($Si_{6-z}Al_z$)$N_{10-z}O_z$) as a host crystal, which is activated by Ce, is known (refer to Patent Reference 7). It is known that, in the phosphor, an emission wavelength may shift to a longer wavelength as an excitation wavelength shifts to a longer wavelength by substituting partially La with Ca while the crystal structure is maintained.

As another example of the oxynitride phosphor, a blue phosphor having a La—N crystal $La_3Si_8N_{11}O_4$ as a host crystal, which is activated by Ce, is known (refer to Patent Reference 8).

As an example of the nitride phosphor, a red phosphor having a crystal of $CaAlSiN_3$ as a host crystal, which is activated by $Eu^{2+}$, is known (refer to Patent Reference 9). Color rendering properties of a white LED are influenced to be improved by utilizing this phosphor. A phosphor to which Ce was added as the activating element was reported to be an orange phosphor.

Thus, an emission color of the phosphor is determined by a combination of a crystal thereof to act as the host crystal and a metal ion (activating ion) being incorporated into the crystal. Further, the combination of the host crystal and the activating ion determines emission characteristics such as an emission spectrum and an excitation spectrum, chemical stability, and thermal stability such that a phosphor is regarded as another different phosphor when a host crystal thereof or an activating ion thereof is different. Moreover, a material having a different crystal structure is different in the emission characteristics or in the stability because the host crystal is different even if the material has the same chemical composition such that the material is regarded as another different phosphor.

Further, kinds of constituent elements can be substituted in many phosphors while the same crystal structure of the host crystal is maintained, thereby changing the emission color. For example, although a phosphor having a YAG crystal to which Ce is added emits light of a green color, a phosphor having a YAG crystal in which Y is partially substituted with Gd and Al is partially substituted with Ga exhibits emission of a yellow color. Further, in a phosphor having $CaAlSiN_3$ to which Eu is added, it is known that a composition thereof varies by partially substituting Ca with Sr while the same crystal structure is maintained such that the emission wavelength shifts to a shorter wavelength. In this way, such a phosphor in which element substitution is performed while the same crystal structure is maintained is regarded as a material of the same group.

From the described above, it is important to find a host crystal having a new crystal structure in developing a new phosphor and it is possible to propose a new phosphor by activating such a host crystal with an emission-causing metal ion to make the host crystal exhibit luminescence characteristics.

PRIOR ART REFERENCES

Patent References

[Patent Reference 1] Japanese Patent No. 3668770, Specification.
[Patent Reference 2] Japanese Patent No. 3837551, Specification.
[Patent Reference 3] Japanese Patent No. 4524368, Specification.
[Patent Reference 4] Japanese Patent No. 3921545, Specification.
[Patent Reference 5] International Publication No. WO2007/066733.
[Patent Reference 6] International Publication No. WO2006/101096.
[Patent Reference 7] International Publication No. WO2005/019376.
[Patent Reference 8] Japanese Patent Application Publication No. 2005-112922.
[Patent Reference 9] Japanese Patent No. 3837588, Specification.

SUMMARY OF THE INVENTION

Problem to be Solved by the Invention

The present invention aims to satisfy such demand and it is one of the objects to provide an inorganic phosphor that has emission characteristics (emission color and excitation characteristics, emission spectrum) different from those of a conventional phosphor, exhibits high emission intensity even when combined with an LED with a wavelength of 470 nm or less, and is chemically and thermally stable. It is another object of the present invention to provide a light-emitting device that utilizes such a phosphor and is excellent in durability and an image display device that utilizes such a phosphor and is excellent in durability.

Means to Solve the Problem

Under such a situation, the present inventors investigated in detail a phosphor having, as a host crystal, a new crystal containing nitrogen and a crystal in which a metal element or N in the crystal structure is substituted by another kind of element, so as to find out that a crystal represented by $A_2(D, E)_5X_9$ wherein at least one of D and E is present and a crystal represented by $Ca_2Si_5O_3N_6$, or an inorganic phosphor comprising a crystal, as the host crystal, having an identical crystal structure to that of the crystal $Ca_2Si_5O_3N_6$, emitted fluorescence of high brightness. Further, the present inventors found out that the inorganic phosphor having a specific composition exhibited the emission of blue-to-red color.

Further, it was found to be possible to obtain a white color light-emitting diode (light-emitting device) with a high emission efficiency and a small temperature fluctuation, an illuminating device with the same diode, and an image display device rendering bright coloring by utilizing such phosphor.

The present inventors conducted an intensive investigation in consideration of the above-mentioned background so as to successfully provide a phosphor rendering emission with high intensity of a specific wavelength region by implementing configurations as described below. Further, a phosphor having excellent emission characteristics was successfully manufactured by employing a method described below. Further, there were successfully provided a light-emitting device, an illuminating device, an image display device, a pigment, and an ultraviolet absorber having excellent features by implementing configurations as described below.

(1) A phosphor comprising: an inorganic compound having: a crystal represented by $A_2(D, E)_5X_9$ wherein at least one of D and E is present; a crystal represented by the $Ca_2Si_5O_3N_6$, which includes an A element, a D element, an E element, and an X element (wherein A is one or two or more kinds of elements selected from the group consisting of Mg, Ca, Sr, and Ba; D is one or two or more kinds of elements selected from the group consisting of Si, Ge, Sn, Ti, Zr, and Hf; E is one or two or more kinds of elements selected from the group consisting of B, Al, Ga, In, Sc, Y, and La; and X is one or two or more kinds of elements selected from the group consisting of O, N, and F), wherein an M element (wherein M is one or two or more kinds of elements selected from the group consisting of Mn, Ce, Pr, Nd, Sm, Eu, Tb, Dy, and Yb) is solid-solved into each of the crystals. Here, the E element may be an optional constituent such that it is not included in the inorganic crystal if x=0 as shown below. That is, the above-mentioned "E element" can be rewritten as the "E element, if necessary".

(2) The phosphor according to the above (1), wherein the crystal represented by $A_2(D,E)_5X_9$ comprises: at least one kind of element selected from the group consisting of Ca, Ba, and Sr at least as the A element; Si as the D element; Al as the E element if necessary; N as the X element; and O as the X element if necessary.

(3) The phosphor according to the above (1), wherein the inorganic crystal having the same crystal structure as the crystal represented by $Ca_2Si_5O_3N_6$ is $Ca_2Si_5O_3N_6$, $(Ca, Ba)_2Si_5O_3N_6$ wherein both Ca and Ba are present, or $(Ca, Sr)_2Si_5O_3N_6$ wherein both Ca and Sr are present, $(Ca,Ba)_2Si_5O_3N_6$, or $(Ca,Sr)_2Si_5O_3N_6$.

(4) The phosphor according to the above (1), wherein the inorganic crystal having the same crystal structure as the crystal represented by $Ca_2Si_5O_3N_6$ is represented by a composition formula of $(Ca,Ba)_2Si_{5-x}Al_xO_{3+x}N_{6-x}$ wherein both Ca and Ba are present or $(Ca,Sr)_2Si_{5-x}Al_xO_{3+x}N_{6-x}$ wherein both Ca and Sr are present (where $0 \leq x \leq 4$).

(5) The phosphor according to the above (1), wherein the M element is Eu.

(6) The phosphor according to the above (1), wherein the crystal represented by $A_2(D,E)_5X_9$ or the inorganic crystal having the same crystal structure as the crystal represented by $Ca_2Si_5O_3N_6$ is a crystal in a monoclinic system.

(7) The phosphor according to the above (1), wherein the crystal represented by $A_2(D,E)_5X_9$ or the inorganic crystal having the same crystal structure as the crystal represented by $Ca_2Si_5O_3N_6$ is a crystal in a monoclinic system and has a symmetry in a space group Cm, and lattice constants a, b, and c have values in the following ranges:
a=0.70588±0.05 nm;
b=2.37480±0.05 nm; and
c=0.96341±0.05 nm.

(8) The phosphor according to the above (1), wherein the inorganic compound is represented by a composition formula of $M_dA_eD_fE_gX_h$ (where, d+e+f+g+h=1 in the formula; M is one or more kinds of elements selected from the group consisting of Mn, Ce, Pr, Nd, Sm, Eu, Tb, Dy, and Yb; A is one or more kinds of elements selected from the group consisting of Mg, Ca, Sr, and Ba; D is one or more kinds of elements selected from the group consisting of Si, Ge, Sn, Ti, Zr, and Hf; E is one or more kinds of elements selected from the group consisting of B, Al, Ga, In, Sc, Y, and La; and X is one or more kinds of elements selected from the group consisting of O, N, and F), and wherein parameters d, e, f, g, and h satisfy all the following conditions:

$$0.00001 \leq d \leq 0.05;$$

$$0.08 \leq e \leq 0.15;$$

$$0.2 \leq f \leq 0.4;$$

$$0 \leq g \leq 0.05; \text{ and}$$

$$0.45 \leq h \leq 0.65.$$

(9) The phosphor according to the above (8), wherein values of the parameters d, e, f, g, and h are within a range satisfying all the conditions of:

$$d+e=(2/16)\pm 0.05;$$

$$f+g=(5/16)\pm 0.05; \text{ and}$$

$$h=(9/16)\pm 0.05.$$

(10) The phosphor according to the above (8), wherein values of the parameters f and g satisfy the condition of: $1/5 \leq f/(f+g) \leq 1$.

(11) The phosphor according to the above (8), wherein: the X element includes N and O, and an atomic ratio of N to O included in the inorganic compound satisfies a condition of $2/9 \leq O/(O+N) \leq 7/9$.

(12) The phosphor according to the above (8), wherein the M element includes at least Eu.

(13) The phosphor according to the above (8), wherein: the A element includes at least one element selected from the group consisting of Ca, Ba, and Sr; the D element includes at least Si; the E element includes at least Al; and the X element includes at least O and N.

(14) The phosphor according to the above (1), wherein the inorganic compound is represented by a composition formula, using parameters x and y, of: $Eu_y (Ca, Ba)_{2-y} Si_{5-x}Al_xO_{3+x}N_{6-x}$ wherein both Ca and Ba are present; or $Eu_y (Ca, Sr)_{2-y}Si_{5-x}Al_xO_{3+x}N_{6-x}$ wherein both Ca and Sr are present, and wherein $0 \leq x < 4$ and $0.0001 \leq y \leq 1$.

(15) The phosphor according to the above (1), wherein the inorganic compound includes a single crystal particle or an aggregate of single crystal particles having a mean particle diameter of at least 0.1 μm and not exceeding 20 μm.

(16) The phosphor according to the above (1), wherein a sum of Fe, Co, and Ni impurity elements included in the inorganic compound does not exceed 500 ppm.

(17) The phosphor according to the above (1), comprising a mixture of a phosphor comprising an inorganic compound recited in the above (1) and another crystal phase or an amorphous phase, wherein a content amount of the phosphor is equal to or more than 20 mass %.

(18) The phosphor according to the above (17), wherein the other crystal phase or the amorphous phase is an inorganic substance having electronic conductivity.

(19) The phosphor according to the above (18), wherein the inorganic substance having the electrical conductivity is oxide, oxynitride, or nitride, any one of which includes one or two or more kinds of elements selected from a group consisting of Zn, Al, Ga, In, and Sn; or a mixture thereof.

(20) The phosphor according to the above (17), wherein the other crystal phase or the amorphous phase is another inorganic phosphor that is different from the phosphor.

(21) The phosphor according to the above (1), wherein the phosphor emits fluorescence having a peak in a wavelength range from 450 nm to 650 nm upon irradiation of an excitation source.

(22) The phosphor according to the above (21), wherein the excitation source is an electron beam; an X-ray or light having a wavelength that is at least 100 nm and not exceeding 450 nm, the light being a vacuum ultraviolet ray, an ultraviolet ray, or visible light.

(23) The phosphor according to the above (1), wherein the crystal represented by $A_2(D,E)_5X_9$; the crystal represented by $Ca_2Si_5O_3N_6$; and the inorganic crystal having the same crystal structure as the crystal represented by $Ca_2Si_5O_3N_6$ has Eu solid-solved thereinto, and wherein the phosphor emits fluorescence of blue-to-red color having a wavelength of at least 450 nm and not exceeding 650 nm upon irradiation of light having a wavelength from 290 nm to 450 nm.

(24) The phosphor according to the above (1), wherein a color of light emitted upon irradiation of an excitation source satisfies, in terms of values of (x, y) of CIE 1931 chromaticity coordinates, the following conditions:

$$0 \leq x \leq 0.8; \text{ and}$$

$$0 \leq y \leq 0.9.$$

(25) A method of manufacturing a phosphor recited in the above (1) comprising: firing a mixture of metal compounds being a raw material mixture, which can constitute the phosphor recited in the above (1) by firing the mixture, in a temperature range of at least 1,200° C. and not exceeding 2,200° C. in an inert atmosphere including nitrogen.

(26) The method of manufacturing the phosphor according to the above (25), wherein the mixture of metal compounds comprises: a compound including M, a compound including A, a compound including D, a compound including E, and a compound including X (wherein M is one or two or more kinds of elements selected from a group consisting of Mn, Ce, Pr, Nd, Sm, Eu, Tb, Dy, and Yb; A is one or two or more kinds of elements selected from a group consisting of Mg, Ca, Sr, and Ba; D is one or two or more kinds of elements selected from a group consisting of Si, Ge, Sn, Ti, Zr, and Hf; E is one or two or more kinds of elements selected from a group consisting of B, Al, Ga, In, Sc, Y, and La; and X is one or two or more kinds of elements selected from a group consisting of O, N, and F).

(27) The method of manufacturing the phosphor according to the above (26), wherein the compound including M is a single kind of substance or a mixture of at least two kinds of substances selected from a group consisting of metal, silicide, oxide, carbonate, nitride, oxynitride, chloride, fluoride and oxyfluoride, each of which includes M; the compound including A is a single kind of substance or a mixture of at least two kinds of substances selected from a group consisting of metal, silicide, oxide, carbonate, nitride, oxynitride, chloride, fluoride, and oxyfluoride, each of which includes A; and the compound including D is a single kind of substance or a mixture of at least two kinds of substances selected from a group consisting of metal, silicide, oxide, carbonate, nitride, oxynitride, chloride, fluoride, and oxyfluoride, each of which includes D.

(28) The method of manufacturing the phosphor according to the above (26), wherein the mixture of metal compounds includes at least nitride or oxide of europium; nitride, oxide, or carbonate of at least one element selected from a group consisting of calcium, barium, and strontium; and silicon oxide or silicon nitride.

(29) The method of manufacturing the phosphor according to the above (25), wherein the inert atmosphere including nitrogen is a nitrogen gas atmosphere in a pressure range of at least 0.1 MPa and not exceeding 100 MPa.

(30) The method of manufacturing the phosphor according to the above (25), wherein graphite is used in a sample container, a heat-insulating element, or a heating element of a firing furnace.

(31) The method of manufacturing the phosphor according to the above (25), wherein the step of firing is performed after the metal compounds in a form of powder or aggregate are filled in a container as being maintained with a filling rate of 40% or less in a bulk density.

(32) The method of manufacturing the phosphor according to the above (25), wherein a container used for the step of firing is made of boron nitride.

(33) The method of manufacturing the phosphor according to the above (25), wherein a mean particle diameter of powder particles or aggregates of the metal compounds is 500 μm or less.

(34) The method of manufacturing the phosphor according to the above (25), wherein a mean particle diameter of aggregates of the metal compounds is controlled to be 500 μm or less by means of a spray dryer, sieving, or pneumatic classification.

(35) The method of manufacturing the phosphor according to the above (25), wherein sintering means is means of pressureless sintering or gas pressure sintering, but not by means of hot pressing.

(36) The method of manufacturing the phosphor according to the above (25), wherein a mean particle diameter of phosphor powder synthesized by firing is controlled to be at least 50 nm and not exceeding 20 μm by one or more techniques selected from pulverization, classification, and acid treatment.

(37) The method of manufacturing the phosphor according to the above (25), wherein a phosphor powder after firing, a phosphor powder after pulverization treatment, or a phosphor powder after controlling a particle size is heat-treated at a temperature that is equal to or higher than 1,000° C. and equal to or lower than a firing temperature.

(38) The method of manufacturing the phosphor according to the above (25), wherein another inorganic compound to form a liquid phase at a temperature equal to or less than the firing temperature is added to the mixture of metal compounds, which is then fired in the firing step.

(39) The method of manufacturing the phosphor according to the above (38), wherein the inorganic compound to form the liquid phase at the temperature equal to or less than the firing temperature is a mixture of one or more kinds of substances selected from a group consisting of fluoride, chloride, iodide, bromide, and phosphate of one or two or more elements selected from a group consisting of Li, Na, K, Mg, Ca, Sr, and Ba.

(40) The method of manufacturing the phosphor according to the above (38), wherein a content amount of the other inorganic compound to form the liquid phase at the temperature equal to or less than the firing temperature is reduced by washing with a solvent after the step of firing.

(41) A light-emitting device comprising at least a light-emitting body and a phosphor, wherein at least a phosphor recited in the above (1) is used as the phosphor.

(42) The light-emitting device according to the above (41), wherein the light-emitting body emits light in the wavelength of 330 to 500 nm and is selected from an organic EL light-emitting body (OLED), a semiconductor laser, a laser diode (LD), or a light-emitting diode (LED).

(43) The light-emitting device according to the above (41), wherein the light-emitting device is a white light-emitting diode, an illuminating device including a plurality of white light-emitting diodes, or a backlight for a liquid crystal panel.

(44) The light-emitting device according to the above (41), wherein the light-emitting body emits ultraviolet or visible light having a peak wavelength of 300 to 450 nm, and wherein the light-emitting device emits white light or light other than the white light by mixing blue-to-red light emitted by a phosphor recited in the above (1) and light having a wavelength of 450 nm or more emitted by another phosphor.

(45) The light-emitting device according to the above (41), further comprising a blue phosphor being caused to emit light having a peak wavelength of 420 nm to 500 nm or less by the light-emitting body.

(46) The light-emitting device according to the above (45), wherein the blue phosphor is selected from a group consisting of AlN: (Eu, Si) wherein both Eu and Si are present, $BaMgAl_{10}O_{17}$:Eu, $SrSi_9Al_{19}ON_{31}$:Eu, $LaSi_9Al_{19}N_{32}$:Eu, α-sialon:Ce, and JEM:Ce.

(47) The light-emitting device according to the above (41), further comprising a green phosphor being caused to emit light having a peak wavelength of at least 500 nm and not exceeding 550 nm by the light-emitting body.

(48) The light-emitting device according to the above (47), wherein the green phosphor is selected from a group consisting of β-sialon:Eu, (Ba, Sr, Ca, Mg)$_2$SiO$_4$:Eu wherein at least one of Ba, Sr, Ca, and Mg is present, (Ca, Sr, Ba)Si$_2$O$_2$N$_2$:Eu wherein at least one of Ca, Sr, and Ba is present.

(49) The light-emitting device according to the above (41), further comprising a yellow phosphor being caused to emit light having a peak wavelength of at least 550 nm and not exceeding 600 by the light-emitting body.

(50) The light-emitting device according to the above (49), wherein the yellow phosphor is selected from a group consisting of YAG:Ce, α-sialon:Eu, CaAlSiN$_3$:Ce, and La$_3$Si$_6$N$_{11}$:Ce.

(51) The light-emitting device according to the above (41), further comprising a red phosphor being caused to emit light having a peak wavelength of at least 600 nm and not exceeding 700 nm by the light-emitting body.

(52) The light-emitting device according to the above (51), wherein the red phosphor is selected from a group consisting of CaAlSiN$_3$:Eu, (Ca, Sr)AlSiN$_3$:Eu wherein both Ca and Sr are present, Ca$_2$Si$_5$N$_8$:Eu, and Sr$_2$Si$_5$N$_8$:Eu.

(53) The light-emitting device according to the above (41), wherein the light-emitting body is an LED for emitting light having a wavelength of 320 to 450 nm.

(54) An image display device comprising: an excitation source and a phosphor, wherein at least a phosphor recited in the above (1) is used as the phosphor.

(55) The image display device according to the above (54), wherein the image display device is a fluorescent display tube (VFD), a field emission display (FED), a plasma display panel (PDP), a cathode-ray tube (CRT), or a liquid crystal display (LCD).

(56) A pigment comprising an inorganic compound recited in the above (1).

(57) An ultraviolet absorber comprising an inorganic compound recited in the above (1).

Effect of the Invention

The phosphor of the present invention includes, as a main component, a multinary nitride or a multinary oxynitride including a divalent element, a trivalent element, and a tervalent element, in particular, such as a crystal represented by $A_2(D,E)_5X_9$ wherein at least D of D and E is present and a crystal represented by $Ca_2Si_5O_3N_6$

EMBODIMENT FOR CARRYING OUT THE INVENTION

Hereafter, a phosphor according to the present invention is described in detail with reference to the drawings.

The phosphor of the present invention includes an inorganic compound having a crystal represented by $A_2(D,E)_5X_9$ wherein at least one of D and E is present; or a crystal represented by $Ca_2Si_5O_3N_6$; or an inorganic crystal having the identical crystal structure to that of the crystal represented by the $Ca_2Si_5O_3N_6$; or a solid solution crystal of these crystals, which includes at least an A element, a D element, an E element, and an X element (where A is one or two or more kinds of elements selected from the group consisting of Mg, Ca, Sr, and Ba; D is one or two or more kinds of elements selected from the group consisting of Si, Ge, Sn, Ti, Zr, and Hf; E is one or two or more kinds of elements selected from the group consisting of B, Al, Ga, In, Sc, Y, and La; and X is one or two or more kinds of elements selected from the group consisting of O, N, and F), wherein an M element (wherein M is one or two or more kinds of elements selected from the group consisting of Mn, Ce, Pr, Nd, Sm, Eu, Tb, Dy, and Yb) is solid-solved into each of the crystals, exhibits high brightness.

The crystal represented by $Ca_2Si_5O_3N_6$, which was newly synthesized and confirmed to be a new crystal through the crystal structure analysis by the present inventors, is a crystal which has not been reported prior to the present invention.

Figure 1:
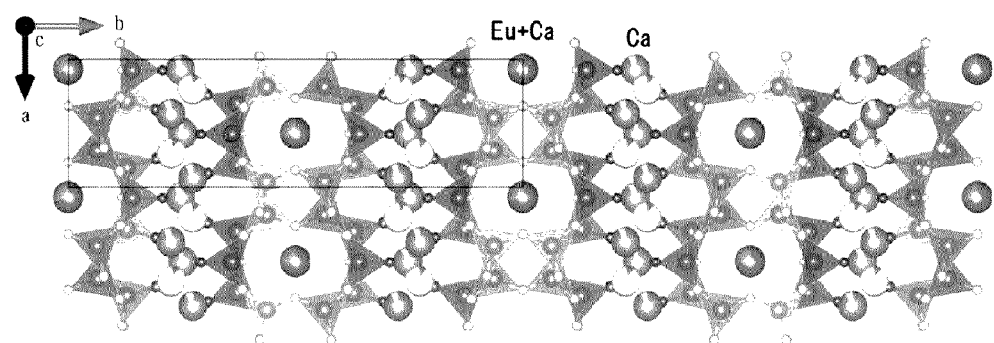
FIG. 1 is a diagram illustrating a crystal structure of $Ca_2Si_5O_3N_6$ crystal.

FIG. 1 is a diagram illustrating a crystal structure of $Ca_2Si_5O_3N_6$ crystal.

The present inventors synthesized $Ca_{1.54}Eu_{0.46}Si_5O_3N_6$, which is one of the $Ca_2Si_5O_3N_6$ crystals and, according to the single crystal structure analysis performed with respect to the $Ca_{1.54}Eu_{0.46}Si_5O_3N_6$ crystal, the $Ca_{1.54}Eu_{0.46}Si_5O_3N_6$ crystal belongs to the monoclinic system and the Cm space group (space group No. 8 in the International Tables for Crystallography), and has crystal parameters and occupancy of the atomic coordinate positions as shown in Table 1. In Table 1, lattice constants a, b, and c signify respective lengths of the axes of the unit cell, and α, β, and γ signify respective angles between axes of the unit cell. The atomic coordinates indicate a position of each atom in the unit cell in terms of a value between 0 and 1 using the unit cell as a unit. According to the analysis results thus obtained, there were atoms of Eu, Ca, Si, N, and O, respectively, and Eu existed in two kinds of sites: (Eu(1) to Eu(2)). The analysis result was obtained that Ca existed in eight (8) kinds of sites (Ca(1) to Ca(2), Ca(3A) and Ca(3B), Ca(4A) and Ca(4B), Ca(5A) and Ca(5B)). The analysis result was also obtained that Si existed in ten (10) kinds of sites (Si(1) to Si(10)). The analysis result was also obtained that N existed in fourteen (14) kinds of sites (N(1) to N(14)). The analysis result was also obtained that O existed in six (6) kinds of sites (O(1) to O(6)).

TABLE 1

| Crystal structure data of $Ca_{1.54}Eu_{0.46}Si_5O_3N_6$ crystal | | | |
|---|---|---|---|
| Crystal composition | | Ca1.54Eu0.46Si5O3N6 | |
| Formula weight (Z) | | 4 | |
| Crystal system | | Monoclinic | |
| Space group | | Cm | |
| Space group number | | 8 | |
| Lattice constants | a | 7.0588 | Å |
| | b | 23.748 | Å |
| | c | 9.6341 | Å |
| | α | 90 | degree |
| | β | 109.038 | degree |
| | γ | 90 | degree |

| Atom | Atomic coordinate | | | Site occupancy rate |
|---|---|---|---|---|
| | x | y | z | |
| Eu(1) | 0.073382 | 1 | 0.06027 | 0.92 |
| Eu(2) | 1.083601 | 1 | 0.559923 | 0.92 |
| Ca(1) | 0.073382 | 1 | 0.06027 | 0.08 |
| Ca(2) | 1.083601 | 1 | 0.559923 | 0.08 |
| Ca(3A) | −0.413752 | 1.252272 | −0.387941 | 0.9302 |
| Ca(3B) | −0.267129 | 1.227422 | −0.238293 | 0.9243 |
| Ca(4A) | 0.742437 | 1.226107 | 0.276908 | 0.9244 |
| Ca(4B) | 0.572522 | 1.252082 | 0.096005 | 0.0698 |
| Ca(5A) | 0.430519 | 1.22584 | −0.054799 | 0.0757 |
| Ca(5B) | −0.577097 | 1.225699 | −0.566233 | 0.0756 |
| Si(1) | 0.713973 | 1.063753 | 0.746962 | 1 |
| Si(2) | −0.153417 | 1.130621 | 0.030048 | 1 |
| Si(3) | 0.32617 | 1.130812 | 0.147345 | 1 |
| Si(4) | 0.324529 | 1.127765 | 0.648598 | 1 |
| Si(5) | −0.153256 | 1.128485 | −0.472328 | 1 |
| Si(6) | 0.712877 | 1.063662 | 0.245132 | 1 |
| Si(7) | 0.45842 | 1.063431 | −0.065904 | 1 |
| Si(8) | 0.090479 | 1.14038 | 0.340485 | 1 |
| Si(9) | 0.082645 | 1.139929 | −0.165006 | 1 |
| Si(10) | 0.458854 | 1.063836 | 0.431906 | 1 |
| N(1) | 0.803123 | 1 | 0.30336 | 1 |
| N(2) | 0.365338 | 1 | −0.050169 | 1 |
| N(3) | 0.691523 | 1.079252 | 0.56398 | 1 |
| N(4) | 0.366949 | 1 | 0.444282 | 1 |
| N(5) | 0.476263 | 1.080269 | 0.260282 | 1 |
| N(6) | 0.475936 | 1.077869 | −0.239292 | 1 |
| N(7) | 0.87107 | 1.114141 | 0.35768 | 1 |
| N(8) | −0.126289 | 1.113233 | −0.136652 | 1 |
| N(9) | 0.693679 | 1.07874 | 0.063842 | 1 |
| N(10) | 0.297696 | 1.112594 | 0.468837 | 1 |
| N(11) | 0.806513 | 1 | 0.802552 | 1 |
| N(12) | 0.086794 | 1.122923 | 0.164487 | 1 |
| N(13) | 0.083137 | 1.118409 | 0.662667 | 1 |
| N(14) | 0.299978 | 1.115552 | −0.03529 | 1 |
| O(1) | −0.233447 | 1.194203 | 0.038154 | 1 |
| O(2) | 0.086052 | 1.207532 | 0.372322 | 1 |

TABLE 1-continued

Crystal structure data of $Ca_{1.54}Eu_{0.46}Si_5O_3N_6$ crystal

| O(3) | −0.217817 | 1.193589 | −0.47382 | 1 |
| O(4) | 0.086756 | 1.207667 | −0.15324 | 1 |
| O(5) | 0.405406 | 1.194826 | 0.181499 | 1 |
| O(6) | 0.391279 | 1.192299 | −0.305651 | 1 |

As a result of the analysis using data in Table 1, the $Ca_{1.54}Eu_{0.46}Si_5O_3N_6$ crystal was found to have the structure as shown in FIG. 1, in which Ca element is included in a skeleton formed by linking tetrahedrons constituted of bonds of Si with O or N. The M element to become an activating ion such as Eu in the crystal is incorporated into the crystal in the type of partial substitution of the Ca element.

As a crystal having a crystal structure identical to the crystal structure of $Ca_{1.54}Eu_{0.46}Si_5O_3N_6$ crystal, which was synthesized and subjected to the structure analysis, there are $A_2(D, E)_5X_9$ crystal wherein at least one of D and E is present, $A_2Si_5O_3N_6$ crystal, and $A_2(Si,Al)_5(O,N)_9$ crystal wherein both Si and Al and both O and N are present in the respective parentheses. The A element is typically Ca, a mixture of Ca and Ba or a mixture of Ca and Sr In $A_2(D,E)_5X_9$ crystal, A can occupy sites which Ca is supposed to occupy, D and E can occupy sites which Si is supposed to occupy, and X can occupy sites which O and N are supposed to occupy, in $Ca_2Si_5O_3N_6$ crystal. Thus, a relative ratio of numbers of atoms can be adjusted to 2 for the A element, 5 for the sum of D and E, and 9 for the sum of X while the crystal structure remains the same. However, it is desirable to have a ratio of cation such as A, D, and E to anion such as X satisfying an electrical neutrality condition in the crystal. In $A_2(Si,Al)_5(O,N)_9$ crystal, Si and Al can occupy sites which Si is supposed to occupy and O and N can occupy sites which N is supposed to occupy in $Ca_2Si_5O_3N_6$ crystal. Thus, a relative ratio of numbers of atoms can be adjusted to 2 for the A element, 5 for the sum of Si and Ai, and 9 for the sum of O and N while the crystal structure remains the same. However, it is desirable to have a ratio of Si/Al and a ratio of O/N satisfying an electrical neutrality condition in the crystal.

The $Ca_2Si_5O_3N_6$ system crystal of the present invention can be identified by means of the X-ray diffraction or the neutron diffraction. A substance exhibiting the identical diffraction to that of the $Ca_2Si_5O_3N_6$ system crystal as a result of the X-ray diffraction in the present invention includes a crystal represented by $A_2(D, E)_5X_9$ wherein at least one of D and E is present. Further the substance includes a crystal in which lattice constants or atomic positions are changed by substituting other elements for constituent elements in the $Ca_2Si_5O_3N_6$ crystal. Here, specific examples of materials in which the constituent elements are substituted with other elements include a material in which Ca in the $Ca_2Si_5O_3N_6$ crystal is partially or completely substituted with the A element other than Ca (here, A is one or two or more kinds of elements selected from the group consisting of Mg, Ca, Sr, and Ba) or the M element (here, M is one or two or more kinds of elements selected from the group consisting of Mn, Ce, Pr, Nd, Sm, Eu, Tb, Dy, and Yb). Further, the specific examples include a material in which Si in the crystal is partially or completely substituted with the D element other than Si (here, D is one or two or more kinds of elements selected from the group consisting of Si, Ge, Sn, Ti, Zr, and Hf). Further, the specific examples include a material in which Al in the crystal is partially or completely substituted with the E element other than Al (here, E is one or two or more kinds of elements selected from B, Al, Ga, In, Sc, Y, and La). Further, the specific examples include a material in which O and N in the crystal are partially or completely substituted with O and N or fluorine. Such substitution is made to satisfy the electrical neutrality in the crystal as a whole. A material in which a crystal structure thereof is not changed as a result of such element substitutions is included in the $Ca_2Si_5O_3N_6$ system crystal. Since emission characteristics, chemical stability, and thermal stability of the phosphor are changed by the substitution of elements, the substitution of elements may be selectively utilized at an appropriate time for each application thereof as far as the crystal structure remains the same.

In the $Ca_2Si_5O_3N_6$ system crystal, the lattice constants change as the constituent components are substituted with other elements or as an activating element such as Eu is solid-solved therein, but the atomic positions given by the crystal structure, sites to be occupied by atoms, and coordinates thereof do not significantly change to an extent in which a chemical bond between skeleton atoms is broken. In the present invention, a crystal structure is defined to be identical to that of $Ca_2Si_5O_3N_6$ crystal if lengths of chemical bonds (distance of neighboring atoms) of Al—N and Si—N calculated from the lattice constants and atomic coordinates obtained by conducting Rietveld analysis of the results from the X-ray diffraction or the neutron diffraction in the space group of Cm are compared with lengths of chemical bonds calculated from the lattice constants and atomic coordinates of $Ca_2Si_5O_3N_6$ crystal as shown in Table 1 such that each difference between corresponding lengths is within ±5%, and, using such definition, it is determined whether the crystal having the crystal structure belongs to the $Ca_2Si_5O_3N_6$ system crystal or not. This determination criterion is employed herein since it was once observed that a crystal in the $Ca_2Si_5O_3N_6$ system crystal was changed to become another crystal due to breakage of chemical bonds when lengths of the chemical bonds were changed beyond ±5% according to the prior experiments.

Further, in case an amount of solid-solution is small, a simple method for determining whether it belongs to the $Ca_2Si_5O_3N_6$ system crystal or not is described as follows. A new substance can be identified to have the same crystal structure if main peaks of the resultant X-ray diffraction pattern measured with the new substance are respectively located at diffraction peak positions, which agree with the peak positions (2θ) of the diffraction pattern calculated using the crystal structure data of Table 1 and the lattice constants calculated from the resultant X-ray diffraction pattern.

Figure 2:
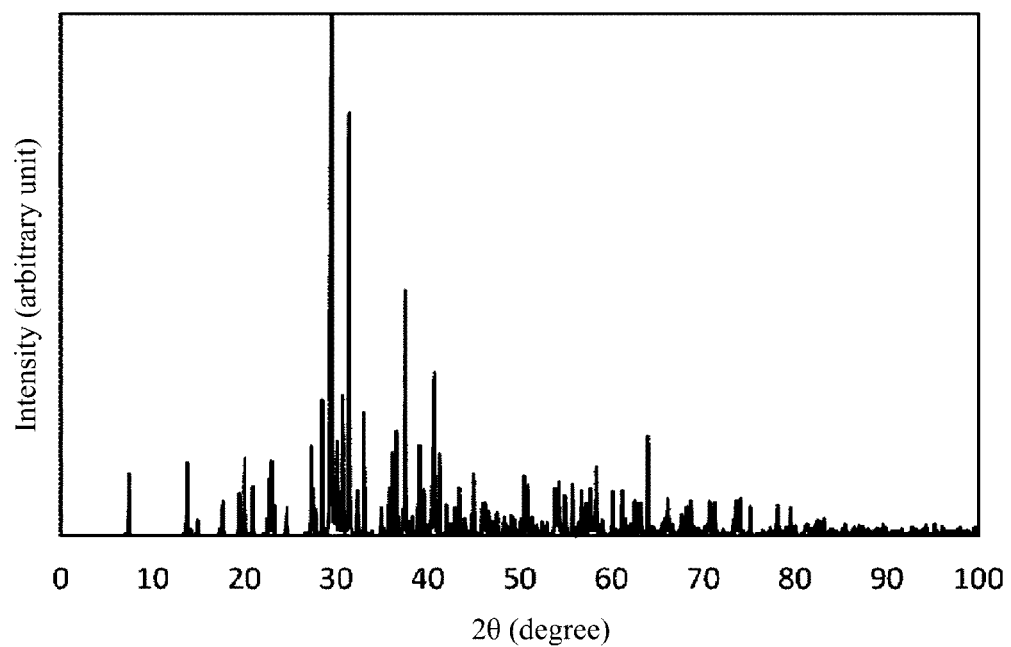
FIG. 2 is a diagram showing a powder X-ray diffraction pattern using Cu Kα-line, calculated from a crystal structure of $Ca_2Si_5O_3N_6$ crystal.

FIG. 2 is a diagram showing a powder X-ray diffraction pattern using Cu Kα-line calculated from the crystal structure of the $Ca_{1.54}Eu_{0.46}Si_5O_3N_6$ system crystal. Since a compound synthesized through an actual synthesis is obtained in a powder state, the spectra of the thus-obtained synthesized compound are compared to those of FIG. 2 and it can be determined whether the synthesized compound belongs to $Ca_2Si_5O_3N_6$ crystal or not.

It is possible to make a simple determination whether a subject substance belongs to the $Ca_2Si_5O_3N_6$ system crystal or not by comparing FIG. 2 and that of the subject substance. It may be good to make a judgment using approximately ten (10) peaks of high(est) intensity in the diffraction pattern as the main peaks of the $Ca_2Si_5O_3N_6$ system crystal. Table 1 is important in this sense since it could be referenced when the identification of the $Ca_2Si_5O_3N_6$ system crystal is conducted. Further, it is also possible to define a crystal structure of the $Ca_2Si_5O_3N_6$ system crystal as an approximate structure using another crystal system of the monoclinic crystal and, in such a case, the crystal structure is expressed using a different space group, different lattice constants, and different plane indices, but the X-ray diffraction results (for example, FIG. 2) and the crystal structure (for example, FIG. 1) remain unchanged such that an identification method and an identification result thereof are the same. Therefore, in the present invention, it is to perform an X-ray diffraction analysis using the monoclinic system. The method of identifying the substance based on Table 1 will be concretely described in Examples to be described later, and the explanation of the method described herein is just in general.

A phosphor can be obtained if the $Ca_2Si_5O_3N_6$ system crystal is activated by the M element which is one or two or more kinds of elements selected from the group consisting of Mn, Ce, Pr, Nd, Sm, Eu, Tb, Dy, Tm, and Yb. Since emission characteristics such as an excitation wavelength, an emission wavelength, and emission intensity may vary depending on the composition of the $Ca_2Si_5O_3N_6$ system crystal, and the kind and quantity of the activating element, such conditions may be chosen in accordance with an application thereof.

With respect to a crystal represented by $A_2 (D,E)_5X_9$ wherein at least D of D and E is present, the crystal exhibits high emission intensity when the crystal has a composition in which, at least, the A element includes either at least one element selected from the group consisting of Ca, Ba, and Sr, the D element includes Si, the E element includes Al if necessary, the X element includes N, and the X element includes O if necessary. In particular, it is the phosphor exhibiting high emission intensity that includes as the host crystal the $(Ca,Ba)_2(Si,Al)_5(O,N)_9$ crystal in which A is a mixture of Ca and Ba, D is Si, E is Al, and X is a combination of N and O wherein both Ca and Ba, both Si and Al, and both O and N are present in the respective parentheses.

The phosphor in which an inorganic crystal thereof having a crystal structure identical to that of the crystal represented by $Ca_2Si_5O_3N_6$ is $Ca_2Si_5O_3N_6$, $(Ca, Ba)_2Si_5O_3N_6$, or $(Ca, Sr)_2Si_5O_3N_6$ has a stable crystal and exhibits high emission intensity wherein both Ca and Ba and both Ca and Sr are present in the respective parentheses.

The phosphor in which an inorganic crystal thereof having a crystal structure identical to that of the crystal represented by $Ca_2Si_5O_3N_6$ has, as a host crystal, a crystal represented by a composition formula: $(Ca, Ba)_2Si_{5-x}Al_xO_{3+x}N_{6-x}$ or $(Ca, Sr)_2Si_{5-x}Al_xO_{3+x}N_{6-x}$ (where $0 \le x \le 4$) exhibits high emission intensity and can be controlled in the color change of the emission by changing the composition thereof wherein both Ca and Ba and both Ca and Sr are present in the respective parentheses.

It is Eu that can be used as the activating M element such that a phosphor exhibiting particularly high emission intensity can be obtained.

In a crystal represented by $A_2(D, E)_5X_9$ wherein at least D of D and E is present or an inorganic crystal having a crystal structure identical to that of the crystal represented by $Ca_2Si_5O_3N_6$, the inorganic crystal is particularly stable if the inorganic crystal is a crystal that belongs to the monoclinic system, and a phosphor having such crystal as a host crystal exhibits high emission intensity.

Further, if a crystal represented by $A_2(D, E)_5X_9$ wherein at least D of D and E is present or an inorganic crystal having a crystal structure identical to that of the crystal. represented by $Ca_2Si_5O_3N_6$ is a crystal that belongs to the monoclinic system and has the symmetry of space group Cm, and in which lattice constants thereof a, b, and c are in the following ranges:

a=0.70588±0.05 nm;
b=2.37480±0.05 nm; and
c=0.96341±0.05 nm, the crystal is particularly stable such that a phosphor having such crystal as a host crystal exhibits high emission intensity. If a crystal is prepared out of the above range, the crystal may become unstable and the emission intensity may occasionally decrease.

A phosphor which is represented by a composition formula $M_dA_eD_fE_gX_h$ (here, in the formula, d+e+f+g+h=1; M is one or two or more kinds of elements selected from Mn, Ce, Pr, Nd, Sm, Eu, Tb, Dy, and Yb; A is one or two or more kinds of elements selected from Mg, Ca, Sr, and Ba; D is one or two or more kinds of elements selected from Si, Ge, Sn, Ti, Zr, and Hf; E is one or two or more kinds of elements selected from B, Al, Ga, In, Sc, Y, and La; X is one or two or more kinds of elements selected from O, N, and F), wherein parameters d, e, f, g, and h satisfy all the following conditions:

$$0.00001 \le d \le 0.05;$$

$$0.08 \le e \le 0.15;$$

$$0.2 \le f \le 0.4;$$

$$0 \le g \le 0.05; \text{ and}$$

$$0.45 \le h \le 0.65,$$

exhibits particularly high emission intensity.

The parameter d represents an additive amount of the activating element, and if the amount is less than 0.00001, an amount of light-emitting ions is insufficient so as to cause brightness to decrease. If the amount is more than 0.05, the emission intensity may be decreased due to the concentration quenching by a mutual interaction between light-emitting ions. The parameter e is a parameter representing a constituent amount of the alkaline earth element such as Ca, and if the amount is less than 0.08 or higher than 0.15, the crystal structure becomes unstable so as to cause the emission intensity to decrease. The parameter f is a parameter representing a constituent amount of the D element such as Si, and if the amount is less than 0.2 or higher than 0.4, the crystal structure becomes unstable so as to cause the emission intensity to decrease. The parameter g is a parameter representing a constituent amount of the E element such as Al, and if the amount is higher than 0.05, the crystal structure becomes unstable so as to cause the emission intensity to decrease. The parameter h is a parameter representing a constituent amount of the X element such as O, N, and F, and if the amount is less than 0.45 or higher than 0.65, the crystal structure becomes unstable so as to cause the emission intensity to decrease. The X element is an anion, and composition ratios of O, N, and F are determined in order to maintain the charge neutrality with cations of the A, M, D and E elements.

A crystal, in which values of the parameters d, e, f, g, and h satisfy all conditions:
d+e=(2/16)±0.05,
f+g=(5/16)±0.05, and
h=(9/16)±0.05,
is stable in the crystal structure and exhibits particularly high emission intensity. In particular, the crystal, in which the values satisfy all conditions:
d+e=2/16,
f+g=5/16, and
h=9/16, that is, the crystal having the $(M,A)_2(D,E)_5X_9$ composition is especially stable in the crystal structure wherein both M and A are present in the former parenthesis and at least D of D and E is present in the latter parenthesis and exhibits particularly high emission intensity.

Further, the crystal having the composition, in which the parameters f and g satisfy the condition: $1/5 \leq f/(f+g) \leq 1$, is stable in the crystal structure and exhibits high emission intensity.

The composition, in which the X element includes N and O and the atomic ratio of N to O included in the inorganic compound satisfies:

$$2/9 \leq O/(O+N) \leq 7/9,$$

is characterized in that the crystal structure thereof is stable and the emission intensity thereof is high.

A phosphor including at least Eu as the M element being the activating element is a phosphor exhibiting high emission intensity among the phosphors of the present invention, and a blue-to-red phosphor can be obtained if the phosphor has a specific composition.

The composition including at least one element selected from a group consisting of Ca, Ba, and Sr as the A element; at least Si as the D element; at least Al as the E element; and at least O and N as the X element is characterized by a stable crystal structure and high emission intensity.

The phosphor in which a composition formula thereof may be represented, using parameters x and y, by: $Eu_y(Ca, Ba)_{2-y}Si_{5-x}Al_xO_{3+x}N_{6-x}$ wherein both Ca and Ba are present, or $Eu_y(Ca, Sr)_{2-y}Si_{5-x}Al_xO_{3+x}N_{6-x}$ wherein both Ca and Sr are present, wherein $0 \leq x < 4$ and $0.0001 \leq y \leq 1$, can be kept in a stable crystal structure while a ratio of Eu/(Ca+Ba) or a ratio of Eu/(Ca+Sr), a ratio of Si/Al, and a ratio of N/O can be changed in the composition range by changing the parameters x and y. Thus, it is a phosphor that allows easy material design since an excitation wavelength thereof or an emission wavelength thereof can be continuously changed by utilizing this feature.

A phosphor in which an inorganic compound includes single crystal particles or an aggregate of the single crystals having a mean particle diameter of 0.1 μm or more and 20 μm or less has high emission efficiency and a good handling property when it is applied to an LED such that it is good to control the particle diameter thereof in this range.

Impurity elements of Fe, Co, and Ni included in the inorganic compound may cause the emission intensity to decrease. If the sum of these impurity elements in the phosphor is controlled to be 500 ppm or less, an influence of these elements on the emission intensity is decreased.

As one of the embodiments of the present invention, there is a phosphor constituted of a mixture of a phosphor having the $Ca_2Si_5O_3N_6$ system crystal as the host crystal and another kind of crystal phase or an amorphous phase wherein a content amount of the phosphor of the $Ca_2Si_5O_3N_6$ system crystal is 20 mass % or more.

In the case where target characteristics cannot be obtained with a single phosphor of the $Ca_2Si_5O_3N_6$ system crystal by itself, or in the case where an additional function such as electric conductivity is added, the phosphor of the present embodiment may be utilized. The content amount of the $Ca_2Si_5O_3N_6$ system crystal phosphor may be adjusted in accordance with the target characteristics, but the emission intensity of the phosphor may be lowered if the content amount is equal to or less than 20 mass %.

In the case where the phosphor is supposed to need electric conductivity in an application in which electron beam excitation or the like is employed, an inorganic substance having electrical conductivity may be added thereto as another crystal phase or an amorphous phase.

As the inorganic substance having the electrical conductivity, oxide; oxynitride; or nitride of one or two or more kinds of elements selected from Zn, Al, Ga, In, and Sn, or a mixture of the above may be named. For example, zinc oxide, aluminum nitride, indium nitride, tin oxide, and so on may be named.

In the case where a target emission spectrum cannot be achieved with a single phosphor of the $Ca_2Si_5O_3N_6$ system crystal, a second phosphor other than the phosphor of the $Ca_2Si_5O_3N_6$ system crystal may be added. As examples of the other phosphors, a BAM phosphor, a β-sialon phosphor, an α-sialon phosphor, a $(Sr,Ba)_2Si_5N_8$ phosphor wherein at least one of Sr and Ba is present, a $CaAlSiN_3$ phosphor, and a $(Ca,Sr)AlSiN_3$ phosphor wherein both Ca and Sr are present may be named.

As one of the embodiments of the present invention, there is a phosphor having a peak at a wavelength in the range of 450 nm to 650 nm by irradiation with an excitation source. For example, a phosphor of the $Ca_2Si_5O_3N_6$ system crystal in which Eu is activated has an emission peak in this range by adjusting the composition.

As one of the embodiments of the present invention, there is a phosphor emitting light with, as an excitation source, an electron beam; an X-ray or light having a wavelength of 100 nm or more to 450 nm or less, such as vacuum ultraviolet light, ultraviolet light, and visible light an. The phosphor can be made to emit light efficiently by using such excitation sources.

As one of the embodiments of the present invention, there is a phosphor constituted of a crystal represented by $A_2(D,E)_5X_9$ wherein at least D of D and E is present or an inorganic crystal having the identical crystal structure to that of the crystal represented by $Ca_2Si_5O_3N_6$, into each of which Eu is solid-solved. Since the phosphor, by adjusting the composition, emits fluorescence of blue-to-red color having a wavelength of at least 450 nm and not exceeding 650 nm upon irradiation of light having a wavelength from 290 nm to 450 nm, it may be good to be used in the application of blue-to-red color emission of a white color LED or the like.

As one of the embodiments of the present invention, there is a phosphor in which a color of light emitted upon irradiation of an excitation source satisfies, in terms of values of (x, y) of CIE 1931 chromaticity coordinates, conditions:

$$0 \leq x \leq 0.8 \text{ and}$$

$$0 \leq y \leq 0.9.$$

For example, it is possible to obtain a phosphor emitting light of the color in the above range on the chromaticity coordinates by adjusting the composition given by $Eu_y(Ca, Ba)_{2-y}Si_{5-x}Al_xO_{3+x}N_{6-x}$ where $0 \leq x < 4$, and $0.0001 \leq y \leq 1$ wherein both Ca and Ba are present.

The phosphor may be utilized in an application of blue-to-red color emission of a white LED or the like.

Thus, as compared with an ordinary oxide phosphor or an existing sialon phosphor, the phosphor of the present invention is characterized by having a wider excitation range of an electron beam and X-ray and light from ultraviolet light to visible light, emitting light of blue-to-red color, in particular, blue-to-red color from 450 nm to 650 nm with a specific composition thereof, and being capable of adjusting an emission wavelength and an emission peak width. Thus, the phosphor of the present invention is suitable for an illuminating device, an image display device, pigment, and an ultraviolet absorber because of such emission characteristics. The phosphor of the present invention has also advantages of excellent heat resistance since it does not degrade even if it is exposed to high temperature, and excellent long-term stability under an oxidizing atmosphere and a moisture environment, and thus a product having excellent durability can be provided by utilizing the phosphor.

A method of manufacturing such a phosphor of the present invention is not particularly limited thereto, but, for example, such a phosphor can be obtained by firing a mixture of metal compounds of a raw material mixture that can constitute a phosphor of the $Ca_2Si_5O_3N_6$ system crystal through firing, in a nitrogen-containing inert atmosphere in the temperature range of 1,200° C. or higher and 2,200° C. or lower. While the main crystal of the present invention belongs to the monoclinic system and the space group Cm, another crystal that belongs to another crystal system and another space group other than the above may be occasionally mixed therein depending on synthesis conditions such as firing temperature. However, even in such a case, a change of the emission characteristics is slight and therefore the thus-obtained product can be used as a high brightness phosphor.

As a starting material, for example, a mixture of metal compounds, which comprises a compound including M, a compound including A, a compound including D, a compound including E, and a compound including X (here, M is one or two or more kinds of elements selected from Mn, Ce, Pr, Nd, Sm, Eu, Tb, Dy, and Yb; A is one or two or more kinds of elements selected from Mg, Ca, Sr, and Ba; D is one or two or more kinds of elements selected from Si, Ge, Sn, Ti, Zr, and Hf; E is one or two or more kinds of elements selected from B, Al, Ga, In, Sc, Y, and La; and X is one or two or more kinds of elements selected from O, N, and F), may be satisfactorily used.

As the starting material, the material, which comprises the compound including M that is a single substance or a mixture of at least two kinds of substances selected from metal, silicide, oxide, carbonate, nitride, oxynitride, chloride, fluoride, or oxyfluoride including M; the compound including A that is a single substance or a mixture of at least two kinds of substances selected from metal, silicide, oxide, carbonate, nitride, oxynitride, chloride, fluoride, or oxyfluoride including A; and the compound including D that is a single substance or a mixture of at least two kinds of substances selected from a metal, silicide, oxide, carbonate, nitride, oxynitride, chloride, fluoride or oxyfluoride, is preferable because these raw materials are easily available and have excellent stability. The material, which comprises the compound including X that is a single substance or a mixture of at least two kinds of substances selected from oxide, nitride, oxynitride, fluoride, and oxyfluoride, is preferable because each raw material is easily available and has excellent stability.

In the case where a phosphor of the $Ca_2Si_5O_3N_6$ crystal system activated by Eu is manufactured, it is preferable to use a starting material comprising, at least, nitride or oxide of europium; nitride, oxide, or carbonate of at least one element selected from the group consisting of calcium, strontium, and barium; and silicon oxide or silicon nitride since the reaction tends to easily proceed during the firing.

Since the firing temperature is high and the firing atmosphere is an inert atmosphere containing nitrogen, an electric furnace of a metal resistance heating type or a graphite resistance heating type, in which a high temperature member of the furnace made of carbon is used, is suitable as a furnace for firing. The nitrogen-containing inert atmosphere in the pressure range of 0.1 MPa or more and 100 MPa or less is preferable because thermal decomposition of nitride or oxynitride of the starting material or the product is suppressed. It is preferable that the oxygen partial pressure is 0.0001% or lower in the firing atmosphere in order to suppress the oxidation reaction of nitride or oxynitride of the starting material or the product.

Here, the firing time is usually 1 to 10 hours or so although it may vary depending on the firing temperature.

In order to manufacture the phosphor in the form of powder or aggregate, it is preferable to utilize a method of firing raw materials after the raw materials are filled in a container with a filling rate kept at the bulk density of 40% or lower. It is possible to prevent particles from adhering with each other by maintaining the bulk density of 40% or lower in the filling rate. Here, the term relative bulk density means the ratio of a value (bulk density) given by dividing the mass of powder material filled in the container by the capacity of the container to the real density of the substance of the powder material.

Various kinds of heat-resistant materials can be used for the container containing the raw material compound in firing the raw material mixture. However, in view of a low adverse effect of material deterioration on the metal nitride used in the present invention, a material suitably includes a boron nitride coated container, which is exemplified by a boron nitride coated graphite crucible used for synthesis of an α-sialon as described in a scientific journal "Journal of the American Ceramic Society" Vol. 85, No. 5, pages 1229 to 1234 in 2002, or boron nitride sintered body. When the firing is performed under such conditions, boron or boron nitride component is mixed into the product from the container, but, if the amount thereof is small, an effect of mixing is slight since the emission characteristics are not so deteriorated. Further, durability of the product may be occasionally improved by the addition of a small amount of boron nitride thereto, and such addition may be preferable in some cases.

In order to manufacture the phosphor in the form of powder or aggregate, it is preferable to make the mean particle diameter of powder particles or aggregate of the raw material equal to or less than 500 μm since the raw material has excellent reactivity and handling characteristics.

As a method of adjusting a particle size of the particles or aggregates to be 500 μm or less, it is preferable to employ a spray dryer, sieving, or pneumatic classification since such a method has excellent operating efficiency and handling characteristics.

As a method of firing, not the hot-pressing, but a method of firing, in which no external mechanical pressing is applied, such as pressureless sintering method and gas pressure sintering method is preferable as a method of obtaining a product of powder or aggregate.

A mean particle diameter of phosphor powder is preferably 50 nm or more and 200 μm or less in terms of a volume-based median diameter (d50) because the emission intensity is high. The volume-based mean particle diameter can be measured, for example, according to a Microtrac or a laser light scattering method. A mean particle diameter of phosphor powder synthesized by firing may be satisfactorily adjusted to be 50 nm or more and 200 μm or less by applying at least one technique selected from pulverization, classification and acid treatment.

A defect included in powder or damage caused by pulverization may be occasionally cured by heat-treating phosphor powder after firing, phosphor powder after pulverizing treatment, or phosphor powder after controlling a particle size at a temperature of 1,000° C. or higher and the firing temperature or lower. The defect or damage may occasionally cause a decrease in the emission intensity, and, in such a case, the emission intensity recovers by the heat treatment.

During firing for synthesis of the phosphor, a stable crystal may be occasionally obtained by adding an inorganic compound forming a liquid phase at a temperature of a firing temperature or lower and firing a mixture thereof such that the liquid phase acts as a flux to promote the reaction and particle growth, and thus the emission intensity may be occasionally improved.

Specific examples of the inorganic compound forming the liquid phase at the temperature of the firing temperature or lower include a single substance or a mixture of two or more kinds of fluoride, chloride, iodide, bromide, or phosphate of one or two or more kinds of elements selected from Li, Na, K, Mg, Ca, Sr, and Ba. The inorganic compounds have different melting points, respectively, and therefore may be satisfactorily used properly depending on a synthesizing temperature.

Further, the emission intensity of the phosphor may occasionally become high by reducing the content amount of the inorganic compound forming the liquid phase at the temperature of the firing temperature or lower by washing the phosphor with a solvent after the firing.

When the phosphor of the present invention is used in an application of a light-emitting device or the like, it is preferable to use the phosphor dispersed in a liquid medium. Further, the phosphor can also be used in the form of a phosphor mixture containing the phosphor of the present invention. A composition prepared by dispersing the phosphor of the present invention in the liquid medium is referred to as a phosphor-containing composition.

As the liquid medium that can be used for the phosphor-containing composition of the present invention, any liquid medium can be selected depending on a purpose or the like, if the liquid medium shows liquid properties under desired use conditions to suitably disperse the phosphor of the present invention, and simultaneously does not cause an undesirable reaction or the like. Specific examples of the liquid medium include an addition reaction type silicone resin and a condensation reaction type silicone resin before curing, a modified silicone resin, an epoxy resin, a polyvinyl resin, a polyethylene resin, a polypropylene resin and a polyester resin. With respect to the liquid media, a single kind of liquid medium may be used by itself, or any combination of two or more kinds of liquid media with any combination ratio thereof may be used.

An amount of used liquid medium or media may be appropriately adjusted depending on an application or the like. In general, the amount is in the range of generally 3 wt % or more and preferably 5 wt % or more, and in the range of generally 30 wt % or less and preferably 15 wt % or less in terms of the weight ratio of the liquid medium to the phosphor of the present invention.

Further, the phosphor-containing composition of the present invention may contain, in addition to the phosphor of the present invention and the liquid medium, any other component depending on an application or the like. Specific examples of the other component include a dispersing agent, a thickening agent, an extending agent and a buffering agent. Specifically, the examples include silica fine powder such as Aerosil, alumina, and so on.

The light-emitting device of the present invention is configured by using at least a light-emitting body or an emission source, and the phosphor of the present invention.

As the light-emitting body or the emission source, there are an LED light-emitting instrument, a laser diode light-emitting instrument, an electroluminescence (EL) light-emitting instrument, a fluorescent lamp, and so on. The LED light-emitting device can be manufactured using the phosphor of the present invention and a publicly known method which is described in Japanese Patent Application Publication No. H05-152609, Japanese Patent Application Publication No. H07-99345, Japanese Patent No. 2927279, and the like. In this case, the light-emitting body or the emission source is preferably what emits light of a wavelength region of from 330 to 500 nm. In particular, an LED light-emitting element emitting an ultraviolet (or violet) ray of a wavelength region of 330 to 420 nm, or an LED light-emitting element emitting blue light in a wavelength region of 420 to 500 nm is preferable. Such LED light-emitting elements include a nitride semiconductor such as GaN or InGaN, which can be an emission source of a predetermined wavelength by adjusting the composition.

As a light-emitting device of the present invention, there are a white light-emitting diode, an illuminating device including a plurality of white light-emitting diodes, a backlight for a liquid crystal panel, and the like, which include the phosphor of the present invention, respectively.

In such light-emitting devices, in addition to the phosphor of the present invention, the device may further include one or two or more kinds of phosphor selected from β-sialon phosphor activated with Eu, α-sialon yellow phosphor activated with Eu, $Sr_2Si_5N_8$ orange phosphor activated with Eu, (Ca,Sr)AlSiN$_3$ orange phosphor activated with Eu wherein both Ca and Sr are present, and CaAlSiN$_3$ red phosphor activated with Eu. As the yellow phosphor other than the above, for example, YAG:Ce, (Ca,Sr,Ba)Si$_2$O$_2$N$_2$:Eu wherein at least one of Ca, Sr, and Ba is present, and the like may be used.

As one aspect of the light-emitting device of the present invention, there is a light-emitting device in which a light-emitting body or an emission source emits ultraviolet light or visible light having a peak wavelength of 300 to 450 nm such that the phosphor of the present invention emits light of blue-to-red color, which is mixed with light having a wavelength of 450 nm or more emitted by the other phosphor of the present invention such that the light-emitting device emits light of a white color or light of another color other than the white color.

As one aspect of the light-emitting device of the present invention, in addition to the phosphor of the present invention, a blue phosphor emitting light having a peak wavelength of 420 nm to 500 nm or less by means of the light-emitting body or the emission source can further be included. Specific examples of such a blue phosphor include AlN:(Eu,Si) wherein both Eu and Si are present, BaMgAl$_{10}$O$_{17}$:Eu, SrSi$_9$Al$_{19}$O$_{31}$:Eu, LaSi$_9$Al$_{19}$N$_{32}$:Eu, α-sialon:Ce, JEM:Ce, and so on.

As one aspect of the light-emitting device of the present invention, in addition to the phosphor of the present invention, a green phosphor emitting light having a peak wavelength of 500 nm or more to 550 nm or less by means of the light-emitting body or the emission source can further be included. Specific examples of such a green phosphor include β-sialon:Eu, (Ba,Sr,Ca,Mg)$_2$SiO$_4$:Eu wherein at least one of Ba, Sr, Ca, and Mg is present, (Ca,Sr,Ba)Si$_2$O$_2$N$_2$:Eu wherein at least one of Ca, Sr, and Ba is present, and so on.

As one aspect of the light-emitting device of the present invention, in addition to the phosphor of the present invention, a yellow phosphor emitting light having a peak wavelength of 550 nm or more to 600 nm or less by mean of the light-emitting body or the emission source can further be included. Specific examples of such a yellow phosphor include YAG:Ce, α-sialon:Eu, CaAlSiN$_3$:Ce, La$_3$Si$_6$N$_{11}$:Ce, and so on.

As one aspect of the light-emitting device of the present invention, in addition to the phosphor of the present invention, a red phosphor emitting light having a peak wavelength of 600 nm or more to 700 nm or less by means of the light-emitting body or the emission source can further be included. Specific examples of such a red phosphor include CaAlSiN$_3$:Eu, (Ca,Sr)AlSiN$_3$:Eu wherein both Ca and Sr are present, Ca$_2$Si$_5$N$_8$:Eu, Sr$_2$Si$_5$N$_8$:Eu, and so on.

As one aspect of the light-emitting device of the present invention, a light-emitting device with high efficiency can be configured since the emission efficiency of the phosphor of the present invention is high if an LED in which the light-emitting body or the emission source emits light having a wavelength of 320 to 450 nm is used.

The image display device of the present invention is constituted of at least an excitation source and the phosphor of the present invention and includes a vacuum fluorescent display (VFD), a field emission display (FED), a plasma display panel (PDP), a cathode-ray tube (CRT), and the like. It has been confirmed that the phosphor of the present invention emits light by excitation of a vacuum ultraviolet ray of 100 to 190 nm, an ultraviolet ray of 190 to 380 nm, an electron beam, or the like, and the above image display devices can be configured by combining these excitation sources and the phosphors of the present invention.

Since the phosphor comprising an inorganic compound crystal phase having a specific chemical composition according to the present invention has a white or a yellow color as an object color, the phosphor can be used as a pigment or a fluorescent pigment. That is, the object color of white or yellow is observed when the phosphor of the present invention is irradiated with sunlight or light from a fluorescent lamp or the like. In view of a good coloring and no degradation over a long period of time, the phosphor of the present invention is suitable for an inorganic pigment. Therefore, when the phosphor of the present invention is used for a paint, ink, color, glaze, colorant to be added to a plastic product or the like, a favorable coloring can be maintained at a high level for a long period of time.

The nitride phosphor of the present invention absorbs ultraviolet light and therefore is suitable also as the ultraviolet absorber. Thus, when the nitride phosphor of the present invention is used as the paint or applied onto a surface of the plastic product or kneaded into an inside thereof, the nitride phosphor has a high effect on screening ultraviolet light to effectively allow protection of a product from ultraviolet degradation.

EXAMPLES

The present invention will be described in more detail with reference to the examples to be shown below, but these examples are disclosed only for the purpose of facilitating understanding the present invention readily such that the present invention is not limited to these examples.

[Raw Materials Used for Synthesis]

The raw material powders used for the synthesis were: silicon nitride powder with a particle size of specific surface area of 11.2 m$^2$/g, oxygen content of 1.29 wt %, and a type content of 95% (SN-E10 grade made by Ube Industries, Ltd.); silicon dioxide powder (SiO$_2$; made by Kojundo Chemical Laboratory Co., Ltd.); aluminum oxide powder with a particle size of specific surface area of 13.2 m$^2$/g (TAIMICRON made by Taimei Chemicals Co., Ltd.); calcium oxide (made by Kojundo Chemical Laboratory Co., Ltd.); strontium oxide (made by Kojundo Chemical Laboratory Co., Ltd.); barium oxide (made by Kojundo Chemical Laboratory Co., Ltd.); and europium oxide (Eu$_2$O$_3$; with purity of 99.9% and made by Shin-Etsu Chemical Co., Ltd.).

[Synthesis and Structure Analysis of Ca$_{1.54}$Eu$_{0.46}$Si$_5$O$_3$N$_6$ Crystal]

A mixture composition of silicon nitride (Si$_3$N$_4$); silicon dioxide (SiO$_2$); calcium oxide (CaO); and europium oxide (Eu$_2$O$_3$) in the cation ratios of Ca:Eu:Si=1.54:0.64:5 was designed. These raw material powders were weighed to be the above-mentioned mixture composition, and mixed for 5 minutes using a pestle and a mortar, each of them being made of sintered silicon nitride body. Next, the thus-obtained powder mixture was fed into a crucible made of sintered boron nitride body. A bulk density of the mixed powders (powder) was approximately 33%.

The crucible containing the mixed powders was set into an electric furnace of a graphite resistance heating type. In the firing operation, first the firing atmosphere was made vacuum of $1\times10^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised to 1,700° C. at a rate of 500° C. per hour, and then the temperature was maintained for two (2) hours.

A synthesized material was observed by means of an optical microscope and a crystal particle having a size of 55 μm×13 μm×8 μm was collected out of the synthesized material. The crystal particle was analyzed using a scanning electron microscope (SEM; SU1510 made by Hitachi High-Technologies Corp.) equipped with an energy dispersive elemental analyzer (EDS; QUANTAX made by Bruker AXS Inc.) so as to perform the elemental analysis for the elements included in the crystal particle. As a result, presence of Ca, Eu, Si, O, and N elements was confirmed, and ratios of the respective number of contained atoms of Ca, Eu, and Si were measured to be 1.54:0.64:5.

Next, the crystal was fixed to a tip top of a glass fiber with an organic adhesive. An X-ray diffraction measurement of the crystal was performed under a condition in which an output of an X-ray source was 50 kV and 50 mA using a single crystal X-ray diffractometer with a rotating target of Mo Kα-line (SMART APEX II Ultra made by Bruker AXS Inc.). As a result, the crystal particle was confirmed to be a single crystal.

Next, the crystal structure of the crystal was determined using single crystal structure analysis software (APEX2 made by Bruker AXS Inc.) from the results of X-ray diffraction measurement. The crystal structure data obtained are shown in Table 1, and diagrams of the crystal structure are shown in FIG. 1. The crystal system, the space group, the lattice constants, and the kinds and positions of atoms are described in Table 1, and the shape and the size of the unit cell and the arrangement of atoms therein can be determined using the data. In addition, Si and Al enter in equivalent atom positions with a certain ratio, and oxygen and nitrogen enter in equivalent atom positions at a certain ratio, and when the ratios are averaged as a whole, the averaged ratio matches the composition fractions of the crystal.

It was found that the crystal belonged to the monoclinic system, and belonged to the space group Cm (space group No. 8 of the International Tables for Crystallography), and the lattice constants a, b, and c were determined as follows: a=0.70588 nm; b=2.37480 nm; c=0.96341 nm; angle α=90°; β=109.038°; and γ=90°. Further, the atom positions were determined as shown in Table 1. Also, while oxygen and nitrogen can occupy the seats where X can sit in the sialon system crystal in general, since Ca is divalent (+2) and Si is tervalent (+4), if the atomic positions and an amount ratio of Ca to Si are given, the ratio of O to N which occupy (O, N) positions can be determined from the condition of the electrical neutrality of the crystal. The composition of the crystal obtained from the Ca:Eu:Si ratio having been measured by means of EDS and the crystal structure data was found to be $Ca_{1.54}Eu_{0.46}Si_5O_3N_6$. Further, if the starting material composition and the crystal composition differ from each other, this might has been caused by formation of a small amount of a second phase having a composition other than $Ca_{1.54}Eu_{0.46}Si_5O_3N_6$. However, the analysis results show a structure of pure $Ca_{1.54}Eu_{0.46}Si_5O_3N_6$ because the single crystal was used in the measurement.

When a similar composition thereof was examined, the $Ca_2Si_5O_3N_6$ crystal was found to allow Ba or Sr to substitute partially or completely Ca while the crystal structure remains the same. That is, the crystal of $A_2Si_5O_3N_6$ (A is one or two kinds of elements selected from Ca, Ba, and Sr, or a mixture thereof) has a crystal structure identical to the crystal structure of the $Ca_2Si_5O_3N_6$ crystal. Further, with respect to the crystal, it was confirmed that Al could substitute partially Si and oxygen could substitute partially N, and that the crystal was one of the compositions of crystallographic group having the same crystal structure as $Ca_2Si_5O_3N_6$ does. Further, the crystal can also be described as a composition represented by: $(Ca, Ba)_2Si_{5-x}Al_xO_{3+x}N_{6-x}$, or $(Ca, Sr)_2Si_{5-x}Al_xO_{3+x}N_{6-x}$ (where $0 \leq x \leq 4$) wherein both Ca and Ba as well as both Ca and Sr are present in the respective parentheses, from the condition of electrical neutrality.

From the crystal structure data, it was confirmed that the crystal was a new substance having not been reported so far. A powder X-ray diffraction pattern calculated from the crystal structure data is shown in FIG. 2. Hereafter, it is possible to determine the formation of the $Ca_2Si_5O_3N_6$ system crystal as shown in FIG. 1 by performing a powder X-ray diffraction measurement of the synthesized material and comparing the measured powder X-ray diffraction pattern with that of FIG. 2 to find they are the same. Further, since the powder X-ray pattern can be calculated from values of the lattice constants obtained from the powder X-ray diffraction measurement and the crystal structure data of Table 2 with respect to what retains the same crystal structure as the $Ca_2Si_5O_3N_6$ system crystal and has the varied lattice constants, the formation of the $Ca_2Si_5O_3N_6$ system crystal can be judged by comparing the measured pattern with the calculated pattern.

When this crystal was irradiated by the black light, it was confirmed that it emitted yellow-to-orange light. Hereinafter, the crystal will be treated as Example 35.

Phosphor Examples and Comparative Example

Examples 1 to 36

According to the design compositions as shown in Tables 2 and 3, raw materials were weighed to be mixture compositions (mole ratios) as shown in Table 4. Although there may be a case in which a design composition in Tables 2 and 3 and a corresponding mixture composition in Table 4 show difference in the composition depending on the kind of each raw material to be used, the mixture composition was determined such that the amount of each metal ion matches therebetween in such a case. Weighed raw material powders were mixed for 5 minutes using a pestle and a mortar made of silicon nitride sintered body. Then, the mixed powders were fed into a crucible made of boron nitride sintered body. A bulk density of the powder body was approximately from 20% to 30%.

The crucible containing the mixed powders was set into an electric furnace of a graphite resistance heating type. In the firing operation, first the firing atmosphere was made vacuum of $1 \times 10^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised at a rate of 500° C. per hour up to each preset temperature as shown in Table 5, and then the temperature was maintained for two (2) hours.

TABLE 2

Design compositions (atomic ratio) in examples and comparative example

| Example | M element | A element Ca | Ba | Sr | E element Al | D element Si | X element O | N |
|---|---|---|---|---|---|---|---|---|
| Comparative example 1 | | 16 | | | | 40 | 24 | 48 |
| Example 2 | Eu 0.02 | 15 | 1 | | | 40 | 24 | 48 |
| Example 3 | Eu 0.02 | 14 | 2 | | | 40 | 24 | 48 |
| Example 4 | Eu 0.02 | 13 | 3 | | | 40 | 24 | 48 |
| Example 5 | Eu 0.02 | 12 | 4 | | | 40 | 24 | 48 |
| Example 6 | Eu 0.02 | 11 | 5 | | | 40 | 24 | 48 |
| Example 7 | Eu 0.05 | 12.95 | 3 | | | 40 | 24 | 48 |
| Example 8 | Eu 0.1 | 12.9 | 3 | | | 40 | 24 | 48 |
| Example 9 | Eu 0.5 | 12.5 | 3 | | | 40 | 24 | 48 |
| Example 10 | Eu 1 | 12 | 3 | | | 40 | 24 | 48 |
| Example 11 | Eu 2 | 11 | 3 | | | 40 | 24 | 48 |
| Example 12 | Eu 0.02 | 12.98 | 3 | | | 40 | 24 | 48 |
| Example 13 | Eu 0.02 | 12.98 | 3 | | 1 | 39 | 25 | 47 |
| Example 14 | Eu 0.02 | 12.98 | 3 | | 2 | 38 | 26 | 46 |
| Example 15 | Eu 0.02 | 12.98 | 3 | | 4 | 36 | 28 | 44 |
| Example 16 | Eu 0.02 | 15 | | 1 | | 40 | 24 | 48 |
| Example 17 | Eu 0.02 | 14 | | 2 | | 40 | 24 | 48 |
| Example 18 | Eu 0.02 | 13 | | 3 | | 40 | 24 | 48 |
| Example 19 | Eu 0.02 | 12 | | 4 | | 40 | 24 | 48 |
| Example 20 | Eu 0.02 | 11 | | 5 | | 40 | 24 | 48 |
| Example 21 | Eu 0.05 | 12.95 | | 3 | | 40 | 24 | 48 |
| Example 22 | Eu 0.1 | 12.9 | | 3 | | 40 | 24 | 48 |
| Example 23 | Eu 0.5 | 12.5 | | 3 | | 40 | 24 | 48 |
| Example 24 | Eu 1 | 12 | | 3 | | 40 | 24 | 48 |
| Example 25 | Eu 2 | 11 | | 3 | | 40 | 24 | 48 |
| Example 26 | Eu 0.02 | 12.98 | | 3 | | 40 | 24 | 48 |
| Example 27 | Eu 0.02 | 12.98 | | 3 | 1 | 39 | 25 | 47 |
| Example 28 | Eu 0.02 | 12.98 | | 3 | 2 | 38 | 26 | 46 |
| Example 29 | Eu 0.02 | 12.98 | | 3 | 4 | 36 | 28 | 44 |
| Example 30 | Eu 3 | 10 | | 3 | | 40 | 24 | 48 |
| Example 31 | Eu 3 | 10 | | 3 | | 40 | 24 | 48 |
| Example 32 | Eu 3 | 10 | | 3 | | 40 | 24 | 48 |
| Example 33 | Eu 0.02 | 12.98 | 3 | | | 40 | 24 | 48 |
| Example 34 | Eu 0.02 | 12.98 | 3 | | | 40 | 24 | 48 |
| Example 35 | Eu 3.68 | 12.32 | | | | 40 | 24 | 48 |
| Example 36 | Eu 0.02 | 12.98 | | 3 | | 40 | 24 | 48 |

TABLE 3

Design compositions (parameter) in examples and comparative example

| Example | | M element (d) | | A element (e) | | | E element (g) Al | D element (f) Si | X element (h) | |
|---|---|---|---|---|---|---|---|---|---|---|
| | | | | Ca | Ba | Sr | | | O | N |
| Comparative example | 1 | | | 0.125 | | | | 0.3125 | 0.1875 | 0.375 |
| Example | 2 | Eu | 0.000156 | 0.117169 | 0.007811 | | | 0.312451 | 0.187471 | 0.374941 |
| Example | 3 | Eu | 0.000156 | 0.109358 | 0.015623 | | | 0.312451 | 0.187471 | 0.374941 |
| Example | 4 | Eu | 0.000156 | 0.101547 | 0.023434 | | | 0.312451 | 0.187471 | 0.374941 |
| Example | 5 | Eu | 0.000156 | 0.093735 | 0.031245 | | | 0.312451 | 0.187471 | 0.374941 |
| Example | 6 | Eu | 0.000156 | 0.085924 | 0.039056 | | | 0.312451 | 0.187471 | 0.374941 |
| Example | 7 | Eu | 0.000391 | 0.101172 | 0.023438 | | | 0.3125 | 0.1875 | 0.375 |
| Example | 8 | Eu | 0.000781 | 0.100781 | 0.023438 | | | 0.3125 | 0.1875 | 0.375 |
| Example | 9 | Eu | 0.003906 | 0.097656 | 0.023438 | | | 0.3125 | 0.1875 | 0.375 |
| Example | 10 | Eu | 0.007813 | 0.09375 | 0.023438 | | | 0.3125 | 0.1875 | 0.375 |
| Example | 11 | Eu | 0.015625 | 0.085938 | 0.023438 | | | 0.3125 | 0.1875 | 0.375 |
| Example | 12 | Eu | 0.000156 | 0.101406 | 0.023438 | | | 0.3125 | 0.1875 | 0.375 |
| Example | 13 | Eu | 0.000156 | 0.101406 | 0.023438 | | 0.007813 | 0.304688 | 0.195313 | 0.367188 |
| Example | 14 | Eu | 0.000156 | 0.101406 | 0.023438 | | 0.015625 | 0.296875 | 0.203125 | 0.359375 |
| Example | 15 | Eu | 0.000156 | 0.101406 | 0.023438 | | 0.03125 | 0.28125 | 0.21875 | 0.34375 |
| Example | 16 | Eu | 0.000156 | 0.117169 | 0.007811 | | | 0.312451 | 0.187471 | 0.374941 |
| Example | 17 | Eu | 0.000156 | 0.109358 | 0.015623 | | | 0.312451 | 0.187471 | 0.374941 |
| Example | 18 | Eu | 0.000156 | 0.101547 | 0.023434 | | | 0.312451 | 0.187471 | 0.374941 |
| Example | 19 | Eu | 0.000156 | 0.093735 | 0.031245 | | | 0.312451 | 0.187471 | 0.374941 |
| Example | 20 | Eu | 0.000156 | 0.085924 | 0.039056 | | | 0.312451 | 0.187471 | 0.374941 |
| Example | 21 | Eu | 0.000391 | 0.101172 | 0.023438 | | | 0.3125 | 0.1875 | 0.375 |
| Example | 22 | Eu | 0.000781 | 0.100781 | 0.023438 | | | 0.3125 | 0.1875 | 0.375 |
| Example | 23 | Eu | 0.003906 | 0.097656 | 0.023438 | | | 0.3125 | 0.1875 | 0.375 |
| Example | 24 | Eu | 0.007813 | 0.09375 | 0.023438 | | | 0.3125 | 0.1875 | 0.375 |
| Example | 25 | Eu | 0.015625 | 0.085938 | 0.023438 | | | 0.3125 | 0.1875 | 0.375 |
| Example | 26 | Eu | 0.000156 | 0.101406 | 0.023438 | | | 0.3125 | 0.1875 | 0.375 |
| Example | 27 | Eu | 0.000156 | 0.101406 | 0.023438 | | 0.007813 | 0.304688 | 0.195313 | 0.367188 |
| Example | 28 | Eu | 0.000156 | 0.101406 | 0.023438 | | 0.015625 | 0.296875 | 0.203125 | 0.359375 |
| Example | 29 | Eu | 0.000156 | 0.101406 | 0.023438 | | 0.03125 | 0.28125 | 0.21875 | 0.34375 |
| Example | 30 | Eu | 0.023438 | 0.078125 | 0.023438 | | | 0.3125 | 0.1875 | 0.375 |
| Example | 31 | Eu | 0.023438 | 0.078125 | 0.023438 | | | 0.3125 | 0.1875 | 0.375 |
| Example | 32 | Eu | 0.023438 | 0.078125 | 0.023438 | | | 0.3125 | 0.1875 | 0.375 |
| Example | 33 | Eu | 0.000156 | 0.101406 | 0.023438 | | | 0.3125 | 0.1875 | 0.375 |
| Example | 34 | Eu | 0.000156 | 0.101406 | 0.023438 | | | 0.3125 | 0.1875 | 0.375 |
| Example | 35 | Eu | 0.02875 | 0.09625 | | | | 0.3125 | 0.1875 | 0.375 |
| Example | 36 | Eu | 0.000156 | 0.101406 | | 0.023438 | | 0.3125 | 0.1875 | 0.375 |

TABLE 4

Raw material mixture compositions (mass ratios) in examples and comparative example

| Example | | Si3N4 | SiO2 | Al2O3 | CaO | BaO | SrO | Eu2O3 |
|---|---|---|---|---|---|---|---|---|
| Comparative Example | 1 | 52.06 | 16.72 | | 31.22 | | | |
| Example | 2 | 57.64 | 8.20 | | | 28.80 | 5.25 | | 0.12 |
| Example | 3 | 55.79 | 7.93 | | | 26.01 | 10.16 | | 0.12 |
| Example | 4 | 54.05 | 7.68 | | | 23.40 | 14.76 | | 0.11 |
| Example | 5 | 52.41 | 7.45 | | | 20.95 | 19.09 | | 0.11 |
| Example | 6 | 50.87 | 7.23 | | | 18.64 | 23.16 | | 0.11 |
| Example | 7 | 54.00 | 7.68 | | | 23.29 | 14.75 | | 0.28 |
| Example | 8 | 53.92 | 7.64 | | | 23.16 | 14.72 | | 0.56 |
| Example | 9 | 53.27 | 7.34 | | | 22.11 | 14.51 | | 2.78 |
| Example | 10 | 52.49 | 6.98 | | | 20.84 | 14.24 | | 5.45 |
| Example | 11 | 51.01 | 6.29 | | | 18.44 | 13.75 | | 10.52 |
| Example | 12 | 54.05 | 7.71 | | | 23.37 | 14.77 | | 0.11 |
| Example | 13 | 52.91 | 7.22 | 1.64 | 23.36 | 14.76 | | 0.11 |
| Example | 14 | 51.77 | 6.74 | 3.27 | 23.36 | 14.76 | | 0.11 |
| Example | 15 | 49.49 | 5.77 | 6.54 | 23.34 | 14.75 | | 0.11 |
| Example | 16 | 57.64 | 8.20 | | | 28.80 | 5.25 | | 0.12 |
| Example | 17 | 55.79 | 7.93 | | | 26.01 | 10.16 | | 0.12 |
| Example | 18 | 54.05 | 7.68 | | | 23.40 | 14.76 | | 0.11 |
| Example | 19 | 52.41 | 7.45 | | | 20.95 | 19.09 | | 0.11 |
| Example | 20 | 50.87 | 7.23 | | | 18.64 | 23.16 | | 0.11 |
| Example | 21 | 54.00 | 7.68 | | | 23.29 | 14.75 | | 0.28 |
| Example | 22 | 53.92 | 7.64 | | | 23.16 | 14.72 | | 0.56 |
| Example | 23 | 53.27 | 7.34 | | | 22.11 | 14.51 | | 2.78 |
| Example | 24 | 52.49 | 6.98 | | | 20.84 | 14.24 | | 5.45 |
| Example | 25 | 51.01 | 6.29 | | | 18.44 | 13.75 | | 10.52 |
| Example | 26 | 54.05 | 7.71 | | | 23.37 | 14.77 | | 0.11 |
| Example | 27 | 52.91 | 7.22 | 1.64 | 23.36 | 14.76 | | 0.11 |
| Example | 28 | 51.77 | 6.74 | 3.27 | 23.36 | 14.76 | | 0.11 |
| Example | 29 | 49.49 | 5.77 | 6.54 | 23.34 | 14.75 | | 0.11 |
| Example | 30 | 49.63 | 5.64 | | | 16.20 | 13.28 | | 15.25 |
| Example | 31 | 49.63 | 5.64 | | | 16.20 | 13.28 | | 15.25 |
| Example | 32 | 49.63 | 5.64 | | | 16.20 | 13.28 | | 15.25 |
| Example | 33 | 47.24 | 15.15 | | | 22.98 | 14.52 | | 0.11 |
| Example | 34 | 47.24 | 15.15 | | | 22.98 | 14.52 | | 0.11 |
| Example | 35 | 53.12 | 5.69 | | | 21.26 | | | 19.93 |
| Example | 36 | 49.58 | 15.90 | | | 24.11 | | 10.29 | 0.11 |

TABLE 5

Firing conditions in examples and comparative example

| Example | | Temperature (° C.) | Ambient pressure (Mpa) | Time (hour) |
|---|---|---|---|---|
| Comparative example | 1 | 1700 | 1 | 2 |
| Example | 2 | 1600 | 1 | 2 |
| Example | 3 | 1600 | 1 | 2 |
| Example | 4 | 1600 | 1 | 2 |
| Example | 5 | 1600 | 1 | 2 |
| Example | 6 | 1600 | 1 | 2 |
| Example | 7 | 1600 | 1 | 2 |
| Example | 8 | 1600 | 1 | 2 |
| Example | 9 | 1600 | 1 | 2 |
| Example | 10 | 1600 | 1 | 2 |
| Example | 11 | 1600 | 1 | 2 |
| Example | 12 | 1600 | 1 | 2 |
| Example | 13 | 1600 | 1 | 2 |
| Example | 14 | 1600 | 1 | 2 |
| Example | 15 | 1600 | 1 | 2 |
| Example | 16 | 1700 | 1 | 2 |
| Example | 17 | 1700 | 1 | 2 |
| Example | 18 | 1700 | 1 | 2 |
| Example | 19 | 1700 | 1 | 2 |
| Example | 20 | 1700 | 1 | 2 |
| Example | 21 | 1700 | 1 | 2 |
| Example | 22 | 1700 | 1 | 2 |
| Example | 23 | 1700 | 1 | 2 |
| Example | 24 | 1700 | 1 | 2 |
| Example | 25 | 1700 | 1 | 2 |
| Example | 26 | 1700 | 1 | 2 |
| Example | 27 | 1700 | 1 | 2 |
| Example | 28 | 1700 | 1 | 2 |
| Example | 29 | 1700 | 1 | 2 |
| Example | 30 | 1550 | 1 | 2 |
| Example | 31 | 1600 | 1 | 2 |
| Example | 32 | 1650 | 1 | 2 |
| Example | 33 | 1700 | 1 | 2 |
| Example | 34 | 1800 | 1 | 2 |
| Example | 35 | 1700 | 1 | 2 |
| Example | 36 | 1700 | 1 | 2 |

Next, each synthesized compound was ground using an agate mortar and the powder X-ray diffraction measurement using Cu Kα-line was carried out. Main formation phases are shown in Table 6. As a result thereof, it was confirmed that a phase having the same crystal structure as the $Ca_2Si_5O_3N_6$ crystal was a main formation phase and a content amount thereof was equal to or more than 20 mass %. Further, it was confirmed that the synthesized material included a rare earth element, an alkaline earth metal, Si, Al, O, and N by the measurement of EDS. That is, it was confirmed that the synthesized material was a phosphor in which a light-emitting ion M such as Eu was solid-solved into the $Ca_2Si_5O_3N_6$ system crystal.

TABLE 6

Main formation phases in examples and comparative example

| Example | | Main phase | Sub phase |
|---|---|---|---|
| Comparative example | 1 | β-Si3N4 | SiO2, Ca(Si2O2N2) |
| Example | 2 | Crystal structure identical to that of Ca2Si5O3N6 | |
| Example | 3 | Crystal structure identical to that of Ca2Si5O3N6 | |
| Example | 4 | Crystal structure identical to that of Ca2Si5O3N6 | |
| Example | 5 | Crystal structure identical to that of Ca2Si5O3N6 | |
| Example | 6 | Crystal structure identical to that of Ca2Si5O3N6 | |
| Example | 7 | Crystal structure identical to that of Ca2Si5O3N6 | |
| Example | 8 | Crystal structure identical to that of Ca2Si5O3N6 | |
| Example | 9 | Crystal structure identical to that of Ca2Si5O3N6 | |
| Example | 10 | Crystal structure identical to that of Ca2Si5O3N6 | |
| Example | 11 | Crystal structure identical to that of Ca2Si5O3N6 | |
| Example | 12 | Crystal structure identical to that of Ca2Si5O3N6 | |
| Example | 13 | Crystal structure identical to that of Ca2Si5O3N6 | |
| Example | 14 | Crystal structure identical to that of Ca2Si5O3N6 | |
| Example | 15 | Crystal structure identical to that of Ca2Si5O3N6 | |
| Example | 16 | Crystal structure identical to that of Ca2Si5O3N6 | β-Si3N4 |
| Example | 17 | Crystal structure identical to that of Ca2Si5O3N6 | |
| Example | 18 | Crystal structure identical to that of Ca2Si5O3N6 | |
| Example | 19 | Crystal structure identical to that of Ca2Si5O3N6 | |
| Example | 20 | Crystal structure identical to that of Ca2Si5O3N6 | BaSi6ON8 |
| Example | 21 | Crystal structure identical to that of Ca2Si5O3N6 | |
| Example | 22 | Crystal structure identical to that of Ca2Si5O3N6 | |
| Example | 23 | Crystal structure identical to that of Ca2Si5O3N6 | |
| Example | 24 | Crystal structure identical to that of Ca2Si5O3N6 | |
| Example | 25 | Crystal structure identical to that of Ca2Si5O3N6 | |
| Example | 26 | Crystal structure identical to that of Ca2Si5O3N6 | |
| Example | 27 | Crystal structure identical to that of Ca2Si5O3N6 | |
| Example | 28 | Crystal structure identical to that of Ca2Si5O3N6 | |
| Example | 29 | Crystal structure identical to that of Ca2Si5O3N6 | |
| Example | 30 | Crystal structure identical to that of Ca2Si5O3N6 | |
| Example | 31 | Crystal structure identical to that of Ca2Si5O3N6 | |
| Example | 32 | Crystal structure identical to that of Ca2Si5O3N6 | |
| Example | 33 | Crystal structure identical to that of Ca2Si5O3N6 | β-Si3N4, Ba5Si2N6 |
| Example | 34 | Crystal structure identical to that of Ca2Si5O3N6 | β-Si3N4, SiO2 |

TABLE 6-continued

Main formation phases in examples and comparative example

Main formation phases

| Example | Main phase | Sub phase |
|---|---|---|
| Example 35 | Ca2Si5O3N6 | |
| Example 36 | Crystal structure identical to that of Ca2Si5O3N6 | β-Si3N4, Sr2Si5N8 |

After firing, the obtained firing products were crushed coarsely and further ground by hand using a crucible and mortar made of silicon nitride sintered body, and then allowed to pass a 30 μm-mesh sieve. When the particle size distribution was measured, the mean particle diameter was 3 to 8 μm.

As a result of irradiating light of wavelength of 365 nm emitted by the lamp onto these powder samples, it was confirmed that these powder samples emitted light of blue-to-red color. An emission spectrum and an excitation spectrum of the powder were measured using a spectrophotofluorometer. Peak wavelengths of the excitation spectra and peak wavelengths of the emission spectra are shown in Table 7. It was confirmed that this phosphor could be excited by an ultraviolet ray of 290 nm to 380 nm and violet or blue light of 380 nm to 450 nm and was a phosphor to emit blue-to-red light.

TABLE 7

Excitation emission characteristics in examples and comparative example

| Example | Excitation peak wavelength (nm) | Emission peak wavelength (nm) | Emission intensity (arbitrary unit) |
|---|---|---|---|
| Comparative example 1 | | | Not emitted |
| Example 2 | 310 | 482 | 0.52 |
| Example 3 | 308 | 478 | 0.57 |
| Example 4 | 297 | 465 | 0.52 |
| Example 5 | 299 | 471 | 0.38 |
| Example 6 | 399 | 584 | 0.23 |
| Example 7 | 294 | 463 | 0.59 |
| Example 8 | 299 | 467 | 0.58 |
| Example 9 | 342 | 580 | 0.48 |
| Example 10 | 441 | 592 | 0.49 |
| Example 11 | 441 | 603 | 0.13 |
| Example 12 | 297 | 465 | 0.58 |
| Example 13 | 293 | 461 | 0.72 |
| Example 14 | 292 | 462 | 0.66 |
| Example 15 | 308 | 466 | 0.93 |
| Example 16 | 310 | 478 | 0.56 |
| Example 17 | 308 | 477 | 0.59 |
| Example 18 | 295 | 466 | 0.67 |
| Example 19 | 292 | 467 | 0.38 |
| Example 20 | 296 | 472 | 0.26 |
| Example 21 | 300 | 462 | 0.64 |
| Example 22 | 292 | 466 | 0.63 |
| Example 23 | 324 | 578 | 0.44 |
| Example 24 | 400 | 591 | 0.32 |
| Example 25 | 442 | 600 | 0.11 |
| Example 26 | 294 | 464 | 0.59 |
| Example 27 | 290 | 461 | 0.69 |
| Example 28 | 295 | 461 | 0.67 |
| Example 29 | 305 | 459 | 0.72 |
| Example 30 | 440 | 587 | 0.1 |
| Example 31 | 347 | 614 | 0.02 |
| Example 32 | 368 | 628 | 0.03 |
| Example 33 | 291 | 464 | 0.27 |
| Example 34 | 296 | 475 | 0.07 |
| Example 35 | 365 | 590 | 0.9 |
| Example 36 | 291 | 464 | 0.27 |

Here, a portion in which a raw material mixture composition and a chemical composition of the synthesized material show discrepancy has a trace amount of substance mixed in the synthesized material as an impurity secondary phase.

Figure 3:
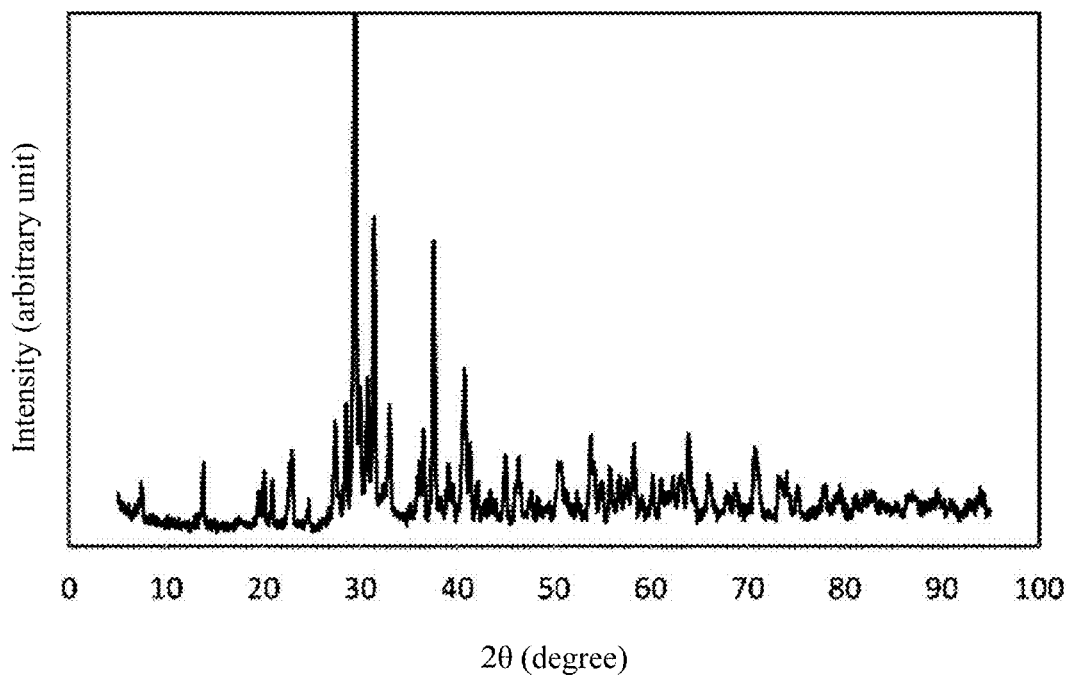
FIG. 3 is a diagram showing a resultant powder X-ray diffraction pattern of a phosphor synthesized in Example 15.

FIG. 3 is a diagram showing a resultant powder X-ray diffraction pattern of a phosphor synthesized in Example 15.

Figure 4:
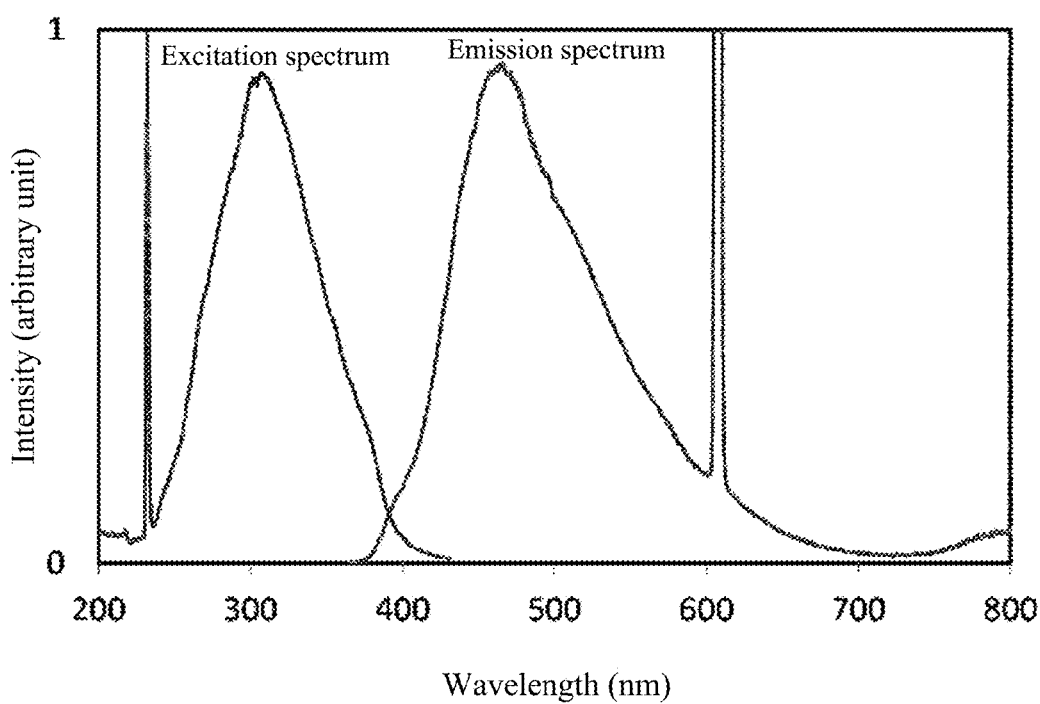
FIG. 4 is a diagram showing an excitation spectrum and an emission spectrum of a phosphor synthesized in Example 15.

FIG. 4 is a diagram showing an excitation spectrum and an emission spectrum of the phosphor synthesized in Example 15.

The results of powder X-ray diffraction of the synthesized phosphors (FIG. 3) show a good agreement with the results of structure analysis (FIG. 2). In Example 15, the measured X-ray diffraction pattern is identical to that of the $Ca_2Si_5O_3N_6$ crystal, and the crystal having the crystal structure identical to that of the $Ca_2Si_5O_3N_6$ crystal was confirmed to be the main component. Further, in Example 15, the synthesized material was confirmed to include Eu, Ca, Ba, Al, Si, O, and N from the measurement by means of EDS. In addition, the ratios of Eu:Ca:Ba:Al:Si were confirmed to be 0.02:12.98:3:4:36. That is, it was confirmed that the synthesized material was a phosphor comprising a $Ca_2Si_5O_3N_6$ system crystal in which Eu was solid-solved. With respect to Example 15, it was found that the phosphor could be excited most efficiently at 308 nm, and the emission spectrum was found to have a peak at 466 nm when the phosphor was excited at 308 nm. Further, an emission color of the phosphor of Example 15 was confirmed to be within the following range: $0 \leq x \leq 0.8$; and $0 \leq y \leq 0.9$ in the CIE 1931 chromaticity coordinates.

As mentioned above, according to Example 35, it was shown that a phosphor comprising a crystal represented by $Ca_2Si_5O_3N_6$, into which Eu was solid solved as the M element, could be obtained. According to Examples 1 to 34 and 36, it was shown that a phosphor comprising, as the inorganic crystal having the identical crystal structure to that of the crystal represented by $Ca_2Si_5O_3N_6$, $(Ca,Ba)_2Si_5O_3N_6$ and $(Ca,Sr)_2Si_5O_3N_6$, into which Eu was solid solved as the M element, could be obtained.

Further, according to Examples 13 to 15 and 27 to 29, it was shown that a phosphor comprising, as the inorganic crystal having the identical crystal structure to that of the crystal represented by $Ca_2Si_5O_3N_6$, $(Ca,Ba)_2Si_{5-x}Al_xO_{3+x}N_{6-x}$ (here, $0 \leq x \leq 4$), into which Eu was solid solved as the M element, could be obtained. According to Example 36, since Sr replaces at least partially Ca, it is also suggested that a phosphor comprising $(Ca,Sr)_2Si_{5-x}Al_xO_{3+x}N_{6-x}$ (here, $0 \leq x \leq 4$), into which the M element is solid solved, may be obtained.

Further, according to Examples 1 to 34, it was shown that the phosphor of the present invention could be represented by $Eu_y(Ca,Ba)_{2-y}Si_{5-x}Al_xO_{3+x}N_{6-x}$ (here, $0 \leq x \leq 4$). According to Example 36, Sr replaces at least partially Ca such that the phosphor represented by $Eu_y(Ca,Sr)_{2-y}Si_{5-x}Al_xO_{3+x}N_{6-x}$ (here, $0 \leq x \leq 4$), as the inorganic crystal having the identical crystal structure to that of the crystal represented by $Ca_2Si_5O_3N_6$, could be suggested.

Figure 5:
FIG. 5 is a diagram showing an object color of a phosphor synthesized in Example 10.

FIG. 5 is a diagram showing an object color of a phosphor synthesized in Example 10.

Figure 6:
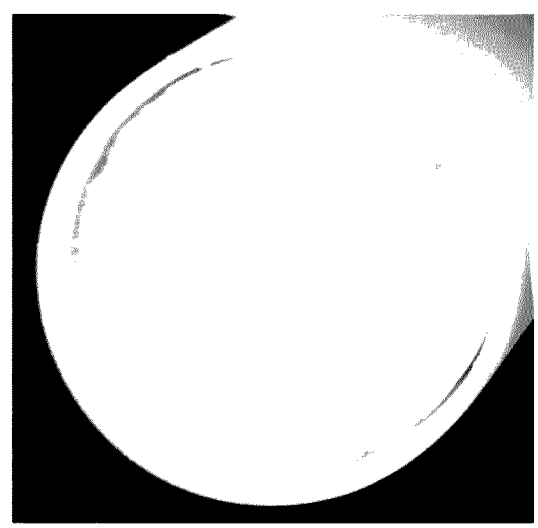
FIG. 6 is a diagram showing an object color of a phosphor synthesized in Example 12.

FIG. 6 is a diagram showing an object color of a phosphor synthesized in Example 12.

As shown in FIGS. 5 and 6, it was confirmed that the phosphor of the present invention had a white or a yellow color as the object color. From this, the phosphor of the present invention could be uses as a pigment or a fluorescent pigment.

Examples of Light-Emitting Device and Image Display Device

Examples 37 to 40

Next, a light-emitting device utilizing the phosphor of the present invention will be described.

Example 37

Figure 7:
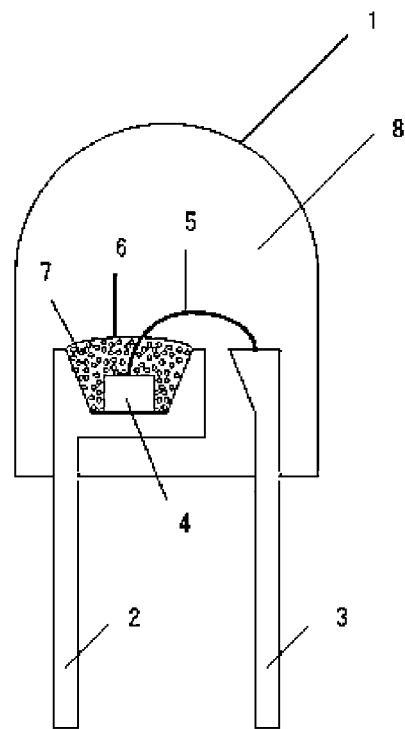
FIG. 7 is a schematic diagram showing an illuminating device (bullet-type of LED illuminating device) according to the present invention.

FIG. 7 is a schematic diagram showing an illuminating device (bullet-type of LED illuminating device) according to the present invention.

A so-called bullet-type white light-emitting diode lamp (1) shown in FIG. 7 was produced. There are two lead wires (2, 3), one of which (2) has a recess, in which an ultraviolet light-emitting diode element (4) having an emission peak of 365 nm is placed. The lower electrode of the ultraviolet light-emitting diode element (4) and the bottom surface of the recess are electrically connected with conductive paste, and the upper electrode and the other lead wire (3) are electrically connected through a gold thin wire (5). The phosphor (7) is dispersed in resin and mounted in the vicinity of the light-emitting diode element (4). The first resin (6) in which this phosphor is dispersed is transparent, and covers the entire ultraviolet light-emitting diode element (4). The tip-top portion of the lead wire including the recess, the ultraviolet light-emitting diode element, and the first resin in which the phosphor is dispersed are sealed with transparent second resin (8). A second resin (8) which is transparent is formed approximately in a cylindrical shape as a whole and the top portion is rounded in a lens shape such that the lamp is generally referred to as a bullet-type.

In the present embodiment, the yellow phosphor prepared for Example 23 and the blue phosphor of JEM:Ce were mixed at the mass ratio of 7:3 to make a phosphor powder, which was further mixed into epoxy resin at the concentration of 37 wt %, and this resultant mixture was dropped in an appropriate amount with a dispenser such that the first resin (6) was formed in which phosphor-mixed droplets (7) were dispersed. The light emitted by the thus-obtained light-emitting device had an emission color of white and characterized by x=0.33 and y=0.33 in the color coordinates.

Example 38

Figure 8:
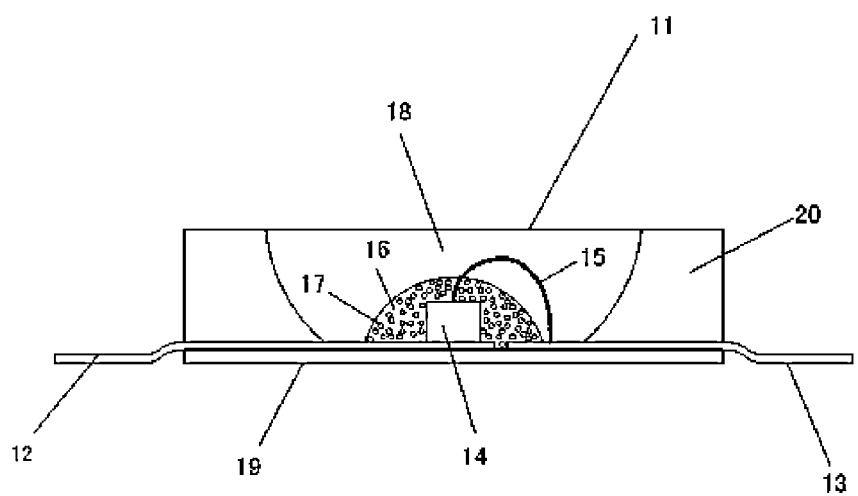
FIG. 8 is a schematic diagram showing an illuminating device (board-mounting-type LED illuminating device) according to the present invention.

FIG. 8 is a schematic diagram showing an illuminating device (board-mounting-type LED illuminating device) according to the present invention.

A chip-type white light-emitting diode lamp (11) for board-mounting as shown in FIG. 8 was produced. Two lead wires (12, 13) are fixed to a white alumina ceramic board (19) having high reflectance of visible light and one end of each of the wires is located at approximately the center portion of the board and the other end of each of the wires extends outside to serve as an electrode to be soldered when the lamp is mounted on the electric board. One of the lead wires (12) has the one end on which an blue light-emitting diode element (14) having an emission peak wavelength of 450 nm is placed and fixed thereto such that the element is located at the center of the board. The lower electrode of the blue light-emitting diode element (14) and the lead wire below are electrically connected with conductive paste, and the upper electrode and the other lead wire (13) are electrically connected to a gold thin wire (15).

A material prepared by mixing the first resin (16) and a blended phosphor (17) prepared by blending the phosphor prepared for Example 23 and a red phosphor of $CaAlSiN_3$:Eu with the mass ratio of 9 to 1 is mounted in the vicinity of the light-emitting diode element. The first resin in which this phosphor is dispersed is transparent, and covers the entire blue light-emitting diode element (14). Also, a wall surface member (20) having a hole opened at the center portion is fixed to the ceramic board. The wall surface member (20) has the center portion formed as the hole in which the blue light-emitting diode element (14) and the resin (16) having the phosphor (17) dispersed therein are contained and the portion of the hole facing the center is made to be a slope. This slope is a reflective surface for taking out light forward, and the shape of the curved surface of the slope is determined in consideration of the direction of light reflection. Further, at least the surface which constitutes the reflective surface forms a surface having high visible light reflectance with white color or metallic luster. In the present example, the wall surface member (20) is configured with white silicone resin. The hole at the center portion of the wall surface member is formed with a recess as the final shape of the chip-type light-emitting diode lamp, and is filled up with second transparent resin (18) to seal all of the blue light-emitting diode element (14) and the first resin (16) in which the phosphor (17) is dispersed. In the present example, the same epoxy resin was used for both the first resin (16) and second resin (18). The percentage of phosphor addition, the attained chromaticity, and the like are approximately identical to those in Example 37.

Next, an example of design of an image display device using the phosphor of the present invention is described.

Example 39

Figure 9:
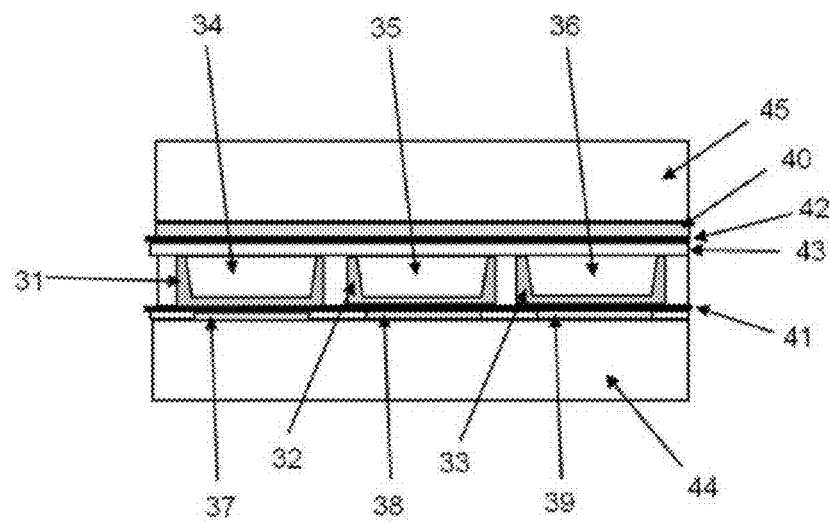
FIG. 9 is a schematic diagram showing an image display device (plasma display panel) according to the present invention.

FIG. 9 is a schematic diagram showing an image display device (plasma display panel) according to the present invention.

A red phosphor ($CaAlSiN_3$:$Eu^{2+}$) (31), a green phosphor (β-sialon:$Eu^{2+}$) (32), and a blue phosphor of Example 15 of the present invention (33) are applied to inner surfaces of the respective cells (34, 35, 36), which are arranged via electrodes (37, 38, 39) and a dielectric layer (41) over a glass substrate (44). If electric power is supplied to the electrodes (37, 38, 39, 40), a vacuum ultraviolet ray is generated by Xe discharge in each of the cells, thereby exciting the respective phosphors so as to emit visible light of a red color, a green color, or a blue color such that the emitted light may be observed from the outside through a protective layer (43), a dielectric layer (42), and a glass substrate (45) so as to serve as an image display.

Example 40

Figure 10:
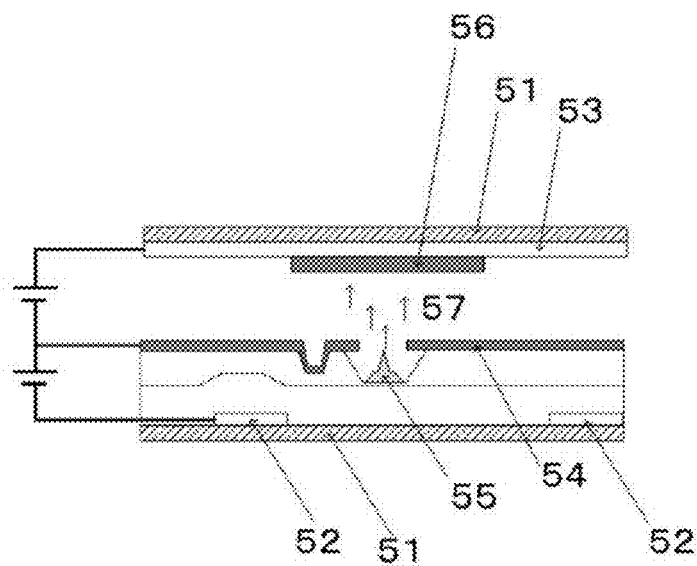
FIG. 10 is a schematic diagram showing an image display device (field emission display panel) according to the present invention.

FIG. 10 is a schematic diagram showing an image display device (field emission display panel) according to the present invention.

The blue phosphor (56) of Example 15 of the present invention is applied to an interior surface of an anode (53). By applying a voltage between a cathode (52) and a gate (54), electrons (57) are emitted from an emitter (55). The electrons are accelerated by the voltage between the anode

(53) and cathode (52), and impinge on the blue phosphor (56) to excite the phosphor to emit light. The entire device is protected by a glass (51). Although the drawing shows a single light emission cell comprising one emitter and one phosphor, a display is actually configured to emit light of a variety of color by arranging many cells for a red color and a green color in addition to for a blue color. Although the phosphors to be used for cells for a green color and a red color are not particularly specified, a phosphor which exhibits high brightness under a low speed electron beam is preferable.

INDUSTRIAL APPLICABILITY

The nitride phosphor of the present invention has different emission characteristics (emission color and excitation characteristics, emission spectrum) from those of the conventional phosphor, exhibits high emission intensity in the case where it is combined with a LED of 470 nm or less, is chemically and thermally stable, and further has little degradation in the brightness of the phosphor when it is exposed to the excitation source such that it is a nitride phosphor to be used suitably for the VFD, the FED, the PDP, the CRT, and the white LED. It is expected that the phosphor of the present invention will be utilized in material design in various kinds of display devices so as to contribute to the development of the industry.

EXPLANATION OF NUMERALS 1 bullet-type light-emitting diode lamp.
2, 3 lead wire.
4 light-emitting diode element.
5 bonding wire.
6, 8 resin.
7 phosphor.
11 chip-type white light-emitting diode lamp for board-mounting.
12, 13 lead wire.
14 light-emitting diode element.
15 bonding wire.
16, 18 resin.
17 phosphor.
19 alumina ceramic board.
20 wall surface member.
31 red phosphor.
32 green phosphor.
33 blue phosphor.
34, 35, 36 ultraviolet ray emission cell.
37, 38, 39, 40 electrode.
41, 42 dielectric layer.
43 protective layer.
44, 45 glass substrate.
51 glass.
52 cathode.
53 anode.
54 gate.
55 emitter.
56 phosphor.
57 electrons.

What is claimed is:

1. A phosphor comprising: an inorganic compound comprising:
a crystal represented by $A_2(D, E)_5X_9$ wherein at least D of the D and E is present; a crystal represented by $Ca_2Si_5O_3N_6$; or an inorganic crystal having a same crystal structure as the crystal represented by the $Ca_2Si_5O_3N_6$, which includes an A element, a D element, an E element, and an X element (wherein A is one or two or more kinds of elements selected from the group consisting of Mg, Ca, Sr, and Ba; D is one or two or more kinds of elements selected from the group consisting of Si, Ge, Sn, Ti, Zr, and Hf; E is one or two or more kinds of elements selected from the group consisting of B, Al, Ga, In, Sc, Y, and La; and X is one or two or more kinds of elements selected from the group consisting of O, N, and F),
wherein an M element (wherein M is one or two or more kinds of elements selected from the group consisting of Mn, Ce, Pr, Nd, Sm, Eu, Tb, Dy, and Yb) is solid-solved into each of the crystals.

2. The phosphor according to claim 1,
wherein the crystal represented by $A_2(D,E)_5X_9$ comprises:
at least one kind of element selected from the group consisting of Ca, Ba, and Sr at least as the A element;
Si as the D element;
Al as the E element if necessary;
N as the X element; and
O as the X element if necessary.

3. The phosphor according to claim 1,
wherein the inorganic crystal having the same crystal structure as the crystal represented by $Ca_2Si_5O_3N_6$ is $Ca_2Si_5O_3N_6$, $(Ca,Ba)_2Si_5O_3N_6$ wherein both Ca and Ba are present, or $(Ca,Sr)_2Si_5O_3N_6$ wherein both Ca and Sr are present.

4. The phosphor according to claim 1,
wherein the inorganic crystal having the same crystal structure as the crystal represented by $Ca_2Si_5O_3N_6$ is represented by a composition formula of $(Ca,Ba)_2Si_{5-x}Al_xO_{3+x}N_{6-x}$ wherein both Ca and Ba are present or $(Ca,Sr)_2Si_5Al_xO_{3+x}N_{6-x}$ wherein both Ca and Sr are present (where $0 \leq x \leq 4$).

5. The phosphor according to claim 1, wherein the M element is Eu.

6. The phosphor according to claim 1, wherein the crystal represented by $A_2(D,E)_5X_9$ or the inorganic crystal having the same crystal structure as the crystal represented by $Ca_2Si_5O_3N_6$ is a crystal in a monoclinic system.

7. The phosphor according to claim 1, wherein the crystal represented by $A_2(D,E)_5X_9$ or the inorganic crystal having the same crystal structure as the crystal represented by $Ca_2Si_5O_3N_6$ is a crystal in a monoclinic system and has a symmetry in a space group Cm, and lattice constants a, b, and c have values in following ranges:
a=0.70588±0.05 nm;
b=2.37480±0.05 nm; and
c=0.96341±0.05 nm.

8. The phosphor according to claim 1,
wherein the inorganic compound is represented by a composition formula of $M_dA_eD_fE_gX_h$ (where
d+e+f+g+h=1 in the formula;
M is one or more kinds of elements selected from the group consisting of Mn, Ce, Pr, Nd, Sm, Eu, Tb, Dy, and Yb;
A is one or more kinds of elements selected from the group consisting of Mg, Ca, Sr, and Ba;
D is one or more kinds of elements selected from the group consisting of Si, Ge, Sn, Ti, Zr, and Hf;
E is one or more kinds of elements selected from the group consisting of B, Al, Ga, In, Sc, Y, and La; and
X is one or more kinds of elements selected from the group consisting of O, N, and F), and wherein parameters d, e, f, g, and h satisfy all following conditions:

$0.00001 \le d \le 0.05;$ $0.08 \le e \le 0.15;$ $0.2 \le f \le 0.4;$ $0 \le g \le 0.05;$ and $0.45 \le h \le 0.65.$ 9. The phosphor according to claim 8, wherein values of the parameters d, e, f, g, and h are within a range satisfying all conditions of:
d+e=(2/16)±0.05;
f+g=(5/16)±0.05; and
h=(9/16)±0.05.

10. The phosphor according to claim 8, wherein values of the parameters f and g satisfy a condition of:

$1/5 \le f/(f+g) \le 1.$

11. The phosphor according to claim 8, wherein:
the X element includes N and O, and
an atomic ratio of N to O included in the inorganic compound satisfies a condition of 2/9≤O/(O+N) 7/9.

12. The phosphor according to claim 8, wherein the M element includes at least Eu.

13. The phosphor according to claim 8, wherein:
the A element includes at least one element selected from the group consisting of Ca, Ba, and Sr;
the D element includes at least Si;
the E element includes at least Al; and
the X element includes at least O and N.

14. The phosphor according to claim 1, wherein the inorganic compound is represented by a composition formula, using parameters x and y, of: $Eu_y(Ca,Ba)_{2-y}Si_{5-x}Al_xO_{3+x}N_{6-x}$ wherein both Ca and Ba are present; or $Eu_y(Ca,Sr)_{2-y}Si_{5-x}Al_xO_{3+x}N_{6-x}$ wherein both Ca and Sr are present, and
wherein 0≤x<4 and 0.0001≤y≤1.

15. The phosphor according to claim 1, wherein the phosphor emits fluorescence having a peak in a wavelength range from 450 nm to 650 nm upon irradiation of an excitation source.

16. The phosphor according to claim 15, wherein the excitation source is an electron beam; an X-ray or light having a wavelength that is at least 100 nm and not exceeding 450 nm, the light being a vacuum ultraviolet ray, an ultraviolet ray, or visible light.

17. The phosphor according to claim 1, wherein the crystal represented by $A_2(D,E)_5X_9$; the crystal represented by $Ca_2Si_5O_3N_6$; and the inorganic crystal having the same crystal structure as the crystal represented by $Ca_2Si_5O_3N_6$ has Eu solid-solved thereinto, and
wherein the phosphor emits fluorescence of blue to red color having a wavelength of at least 450 nm and not exceeding 650 nm upon irradiation of light having a wavelength from 290 nm to 450 nm.

18. The phosphor according to claim 1, wherein a color of light emitted upon irradiation of an excitation source satisfies, in terms of values of (x, y) of CIE 1931 chromaticity coordinates, conditions:

$0 \le x \le 0.8;$ and $0 \le y \le 0.9.$

19. A method of manufacturing a phosphor recited in claim 1 comprising:
firing a mixture of metal compounds being a raw material mixture, which can constitute the phosphor recited in claim 1 by firing the mixture, in a temperature range of at least 1,200° C. and not exceeding 2,200° C. in an inert atmosphere including nitrogen.

20. A light-emitting device comprising at least a light-emitting body and a phosphor,
wherein at least a phosphor recited in claim 1 is used as the phosphor.

21. The light-emitting device according to claim 20, wherein the light-emitting body emits light in the wavelength of 330 to 500 nm and is selected from is an organic EL light-emitting body (OLED), a semiconductor laser, a laser diode (LD), or a light-emitting diode (LED).

22. The light-emitting device according to claim 20, wherein the light-emitting device is a white light-emitting diode, an illuminating device including a plurality of white light-emitting diodes, or a backlight for a liquid crystal panel.

23. The light-emitting device according to claim 20, wherein the light-emitting body emits ultraviolet or visible light having a peak wavelength of 300 to 450 nm, and
wherein the light-emitting device emits white light or light other than the white light by mixing blue-to-red light emitted by the phosphor recited in claim 1 and light having a wavelength of 450 nm or more emitted by another phosphor.

24. The light-emitting device according to claim 20, further comprising a blue phosphor being caused to emit light having a peak wavelength of 420 nm to 500 nm or less by the light-emitting body.

25. The light-emitting device according to claim 24, wherein the blue phosphor is selected from a group consisting of AlN:(Eu, Si) wherein both Eu and Si are present, $BaMgAl_{10}O_{17}$:Eu, $SrSi_9Al_{19}ON_{31}$:Eu, $LaSi_9Al_{19}N_{32}$:Eu, α-sialon:Ce, and JEM:Ce.

26. The light-emitting device according to claim 20, further comprising a green phosphor being caused to emit light having a peak wavelength of at least 500 nm and not exceeding 550 nm by the light-emitting body.

27. The light-emitting device according to claim 26, wherein the green phosphor is selected from a group consisting of β-sialon:Eu, $(Ba,Sr,Ca,Mg)_2SiO_4$:Eu wherein at least one of Ba, Sr, Ca, and Mg is present, $(Ca,Sr,Ba)Si_2O_2N_2$:Eu wherein at least one of Ca, Sr, and Ba is present.

28. The light-emitting device according to claim 20, further comprising a yellow phosphor being caused to emit light having a peak wavelength of at least 550 nm and not exceeding 600 by the light-emitting body.

29. The light-emitting device according to claim 28, wherein the yellow phosphor is selected from a group consisting of YAG: Ce, α-sialon:Eu, $CaAlSiN_3$:Ce, and $La_3Si_6N_{11}$:Ce.

30. The light-emitting device according to claim 20, further comprising a red phosphor being caused to emit light having a peak wavelength of at least 600 nm and not exceeding 700 nm by the light-emitting body.

31. The light-emitting device according to claim 30,
wherein the red phosphor is selected from a group consisting of $CaAlSiN_3$:Eu, $(Ca,Sr)AlSiN_3$:Eu wherein both Ca and Sr are present, $Ca_2Si_5N_8$:Eu, and $Sr_2Si_5N_8$:Eu.

32. The light-emitting device according to claim 20,
wherein the light-emitting body is an LED for emitting light having a wavelength of 320 to 450 nm.

33. An image display device comprising: an excitation source and a phosphor,
wherein at least a phosphor recited in claim 1 is used as the phosphor.

34. The image display device according to claim 33,
wherein the image display device is a fluorescent display tube (VFD), a field emission display (FED), a plasma display panel (PDP), a cathode-ray tube (CRT), or a liquid crystal display (LCD).

35. A pigment comprising an inorganic compound recited in claim 1.

36. An ultraviolet absorber comprising an inorganic compound recited in claim 1.

\* \* \* \* \*